(12) United States Patent
Luo

(10) Patent No.: US 11,437,389 B2
(45) Date of Patent: Sep. 6, 2022

(54) INTEGRATED ASSEMBLIES AND METHODS OF FORMING INTEGRATED ASSEMBLIES

(71) Applicant: Micron Technology, Inc., Boise, ID (US)

(72) Inventor: Shuangqiang Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 294 days.

(21) Appl. No.: 16/811,118

(22) Filed: Mar. 6, 2020

(65) Prior Publication Data

US 2021/0280597 A1    Sep. 9, 2021

(51) Int. Cl.
*H01L 27/11556* (2017.01)
*G11C 5/06* (2006.01)
*G11C 5/02* (2006.01)
*H01L 27/11582* (2017.01)

(52) U.S. Cl.
CPC ........ *H01L 27/11556* (2013.01); *G11C 5/025* (2013.01); *G11C 5/06* (2013.01); *H01L 27/11582* (2013.01)

(58) Field of Classification Search
CPC ......... H01L 27/11556; H01L 27/11582; G11C 5/025; G11C 5/06

USPC ....................................................... 257/314
See application file for complete search history.

(56) References Cited

U.S. PATENT DOCUMENTS 11,183,512 B2 * 11/2021 Huo .................. H01L 27/11556

\* cited by examiner

*Primary Examiner* — Tu-Tu V Ho
(74) *Attorney, Agent, or Firm* — Wells St. John P.S.

(57) ABSTRACT

Some embodiments include an integrated assembly having a memory array region which includes channel material pillars extending through a stack of alternating conductive and insulative levels. A second region is adjacent the memory array region. A conductive expanse is within the memory array region and electrically coupled with the channel material of the channel material pillars. A panel extends across the memory array region and the second region. The panel separates one memory block region from another. The panel has a first portion over the conductive expanse, and has a second portion adjacent the first portion. The panel has a bottom surface. A first segment of the bottom surface is adjacent an upper surface of the conductive expanse. A segment of the bottom surface within the second portion is elevationally offset relative to the first segment. Some embodiments include methods of forming integrated assemblies.

37 Claims, 43 Drawing Sheets

INTEGRATED ASSEMBLIES AND METHODS OF FORMING INTEGRATED ASSEMBLIES

TECHNICAL FIELD

Integrated assemblies (e.g., memory devices; such as, for example, devices suitable for utilization with NAND). Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells (memory structures).

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device 2101 is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The memory arrays (memory devices) described above may be fabricated on semiconductor dies. FIGS. 5-8 illustrate regions of an example integrated assembly 600 associated with a conventional die comprising conventional memory devices. The top-down view of FIG. 5 shows that the integrated assembly 600 includes a staircase region (or stadium region) 602 adjacent a memory array region 604. A gap is provided between the staircase region 602 and the memory array region 604 to indicate that there may be additional components between the staircase region and the memory array region.

The memory array region and staircase region are subdivided amongst memory device sub-blocks (also referred to herein as memory blocks, or as memory block regions) 608 and 610.

Peripheral regions 612, 614 and 616 are along edges of the block regions 608 and 610. The peripheral region 614 is between the block regions 608 and 610; the peripheral region 612 is on an opposing side of the block region 608 from the peripheral region 614; and the peripheral region 616 is on an opposing side of the block region 610 from the peripheral region 614. The regions 612, 614 and 616 may be considered to comprise slits filled with insulative material 618.

Channel material pillars 620 (only a couple of which are labeled) are within the memory array region 604, and pass through a stack of conductive levels (discussed below). The channel material pillars 620 are shown to be circular, but may comprise any suitable shapes.

FIG. 6 shows a cross-sectional side view within a region "6" of FIG. 5. The illustrated region includes a stack 622 of alternating conductive levels 624 and insulative levels 626.

The conductive levels 624 comprise conductive material 628, and the insulative levels 626 comprise insulative material 630.

The conductive material 628 may comprise any suitable composition(s); and in some applications may comprise metal-containing material (e.g. tungsten). In some applications, the conductive material 628 may comprise a tungsten core at least partially surrounded by a liner comprising metal nitride (e.g., titanium nitride). In some applications, dielectric-barrier material (e.g., aluminum oxide) may at least partially surround the metal nitride liners within the illustrated levels 624. Accordingly, some of the material within the levels 624 may be insulative in some applications.

The insulative material 630 may comprise any suitable composition(s); and in some applications may comprise, consist essentially of, or consist of silicon dioxide.

The channel material pillars 620 extend through the stack 622, and comprise channel material 632. The channel material 632 may, for example, comprise, consist essentially of, or consist of appropriately-doped silicon. The channel material pillars 620 are shown to be annular rings surrounding insulative material 634. Such configuration of the channel material pillars may be considered to correspond to a "hollow" channel configuration, with the insulative material 634 being provided within the hollows of the channel material pillars. In other applications, the channel material may be configured as solid pillars, rather than being configured as the illustrated hollow pillars.

The channel material pillars 620 are spaced from the conductive levels 624 of the stack 622 by intervening regions 636. The regions 636 may comprise tunneling material, charge-storage material, charge-blocking material and dielectric-barrier material. The tunneling material (also referred to as gate dielectric material) may comprise one or more of silicon dioxide, aluminum oxide, hafnium oxide, zirconium oxide, etc. The charge-storage material may comprise charge-trapping material (e.g., one or more of silicon nitride, silicon oxynitride, conductive nanodots, etc.). The charge-blocking material may comprise one or more of silicon dioxide, silicon oxynitride, aluminum oxide, hafnium oxide, zirconium oxide, etc. The dielectric-barrier material may comprise one or more of aluminum oxide, hafnium oxide, zirconium oxide, etc.

Memory cells (e.g., NAND memory cells) 638 (only some of which are labeled) are along the channel material pillars 620. The memory cells 638 include regions of the conductive levels 624 (specifically, control gate regions), portions of the channel material 632, and portions of the tunneling material, charge-storage material, charge-blocking material and dielectric-barrier material within the intervening regions 636. The memory cells 638 are vertically stacked one atop another. In some embodiments, the assembly 600 may be considered to comprise a three-dimensional NAND configuration (three-dimensional memory device) analogous to the configuration described above with reference to FIG. 2.

The conductive levels 624 may be referred to as wordline/control gate levels, in that they include wordlines and control gates associated with the vertically-stacked memory cells 638 of NAND strings. The number of memory cell levels in individual strings may be determined by the number of conductive levels 624. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The stack 622 is shown to be supported over a source structure 640. Such source structure may be analogous to the source structures 216 discussed above. The channel material 632 of the channel material pillars 620 is electrically coupled with the source structure 640. The source structure 640 may comprise any suitable composition(s). For instance, the source structure may comprise conductively-doped silicon over tungsten silicide.

A gap is provided between the stack 622 and the source structure 640. Source-side select gates (SGSs) 639 may be adjacent regions of the channel material pillars within such gaps. The SGSs 639 are diagrammatically illustrated with dashed ellipses.

The source structure 640 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

FIG. 7 shows details about a region "7" associated with the staircase region 602 of FIG. 5. The illustrated region of FIG. 7 includes the peripheral regions 612, 614 and 616 extending along the memory blocks 608 and 610. The stack 622 of FIG. 6 may pass through and around the illustrated region of FIG. 7. Oxide 642 is provided to breakup such stack in some portions of the region of FIG. 7 to reduce stresses that may result from the significant amount of metal in the stack. Bridging regions (not shown) may be provided to pass portions of the stack 622 through the oxide so that the conductive levels of the stack 622 reach the illustrated interconnect regions 646.

The interconnect regions (tier connection regions) 646 may be utilized for forming electrical connections to the conductive levels 624 (FIG. 6). Each of the conductive levels may be referred to as a tier. The illustrated regions 646 may be utilized to form connections to sets of the tiers. For instance, in the illustrated application one of the regions 646 is utilized for forming connections to tiers 1-9, another is utilized for forming connections to tiers 10-18, another is utilized for forming connections to tiers 19-27, etc. The number of tiers accessed within each of the regions 646 may be determined by the overall number of conductive levels 624 (FIG. 6) and the overall number of the regions 646.

A portion of the construction of FIG. 7 between a first of the regions 646 (the illustrated interconnect region comprising Tiers 1-9) and the memory array may be referred to as an intervening region (crest region) 645.

Connection regions 643 may be provided within the crest region 645. Such connection regions may be utilized for organizing connections which extend to various components associated with the memory array. For instance, connections from drain-side select gates (SGDs) to logic circuitry (e.g., CMOS) may be provided within the connection regions 643.

FIG. 8 shows a cross-sectional side view along the line 8-8 of FIG. 7. The conductive levels 624 are shown to have staggered terminal regions 648 within the interconnect connection regions 646, with such staggered terminal regions having a "staircase" configuration. The staggered terminal regions of the conductive levels 624 enable connections to be made from such conductive levels to appropriate circuitry (e.g., wordline driver circuitry). The view of FIG. 8 shows three of the conductive levels 624 being accessed in each of the interconnect regions 646. Such is for illustrative purposes only. Any suitable number of the conductive levels 624 may be accessed in the interconnect regions 646.

FIG. 8 shows example support structures 650 extending through materials of the illustrated region 602. The support structures include insulative material 652 and conductive material 654. The conductive material 654 is shown to be electrically coupled with the source structure 640. In other embodiments, the support structures may have other configurations and may or may not comprise the conductive material 654; and if they do comprise the conductive material 654, such may or may not extend to be electrically coupled with the source structure 640. The illustrated conductive structures 654 may be "live" (i.e., may be electrically coupled with active electrical circuits), or may be "dummy" (i.e., may have no electrical function, and may instead be provided solely for physical support).

FIGS. 9-9C illustrate an example configuration for the connection regions 643. The regions 612, 614 and 616 are shown to be configured as panels 703 comprising insulative material 702. Such panels space the memory block region 608 from the memory block region 610. Although the panels of the regions 612, 614 and 616 are shown to only comprise a single material, in some applications the panels 703 may comprise two or more materials.

Conductive interconnects 700 are coupled with conductive blocks 704. The blocks 704 are formed at a same elevational levels as regions of the source structure 640, as shown in FIG. 9A. The regions of the source structure 640 are under the panels 703, and extend from the memory array region 604 (FIG. 5) to the staircase region 602 (FIG. 5).

The conductive blocks 704 are over conductive structures 706 which couple with CMOS and/or other appropriate logic circuitry.

The conductive blocks 704 and conductive structures 706 are shown to be supported within an insulative material 710. The material 710 may comprise any suitable composition(s), and in some embodiments may comprise silicon dioxide.

In the illustrated application, the conductive interconnects 700 are utilized for coupling the CMOS circuitry with drain-side select gates (SGDs). Such SGDs may be associated with the memory array 604 (FIG. 5).

A problem with the configuration of FIGS. 9-9C is that the conductive structures 640 and 704 of FIG. 9A may interfere with one another. For instance, if misalignment occurs during formation of the patterned structures 640 and 704, then shorts may occur between adjacent structures 640 and 704. Further, the proximity of the structures 640 and 704 may lead to problematic parasitic capacitance between neighboring structures 640 and 704.

It would be desirable to develop new configurations which alleviate or prevent the problems described above with reference to FIGS. 9-9C, and to develop methods for fabricating such configurations.

BRIEF DESCRIPTION OF THE DRAWINGS

FIGS. 10A-1 and 10A-2 are diagrammatic cross-sectional side views along the same cross-section as 10A, and showing the example assembly in accordance with other example embodiments.

FIGS. 11A-1 and 11A-2 are diagrammatic cross-sectional side views along the same cross-section as 11A, and showing the example assembly in accordance with other example embodiments.

FIGS. 13-13B are along the same cross-sections as FIGS. 12-12B, respectively.

FIGS. 14-14B are along the same cross-sections as FIGS. 12-12B, respectively.

FIGS. 15-15B are along the same cross-sections as FIGS. 12-12B, respectively.

FIGS. 16-16B are along the same cross-sections as FIGS. 12-12B, respectively.

DETAILED DESCRIPTION OF THE ILLUSTRATED EMBODIMENTS

Some embodiments include assemblies having memory blocks spaced from one another by intervening panels. Bottom surfaces of the intervening panels are along source structures, and along gaps formed between source structures. Regions of the bottom surfaces along the gaps are elevationally offset relative to regions of the bottom surfaces along the source structures. Some embodiments include methods of forming assemblies. Example embodiments are described with reference to FIGS. 10-20.

Figure 9:
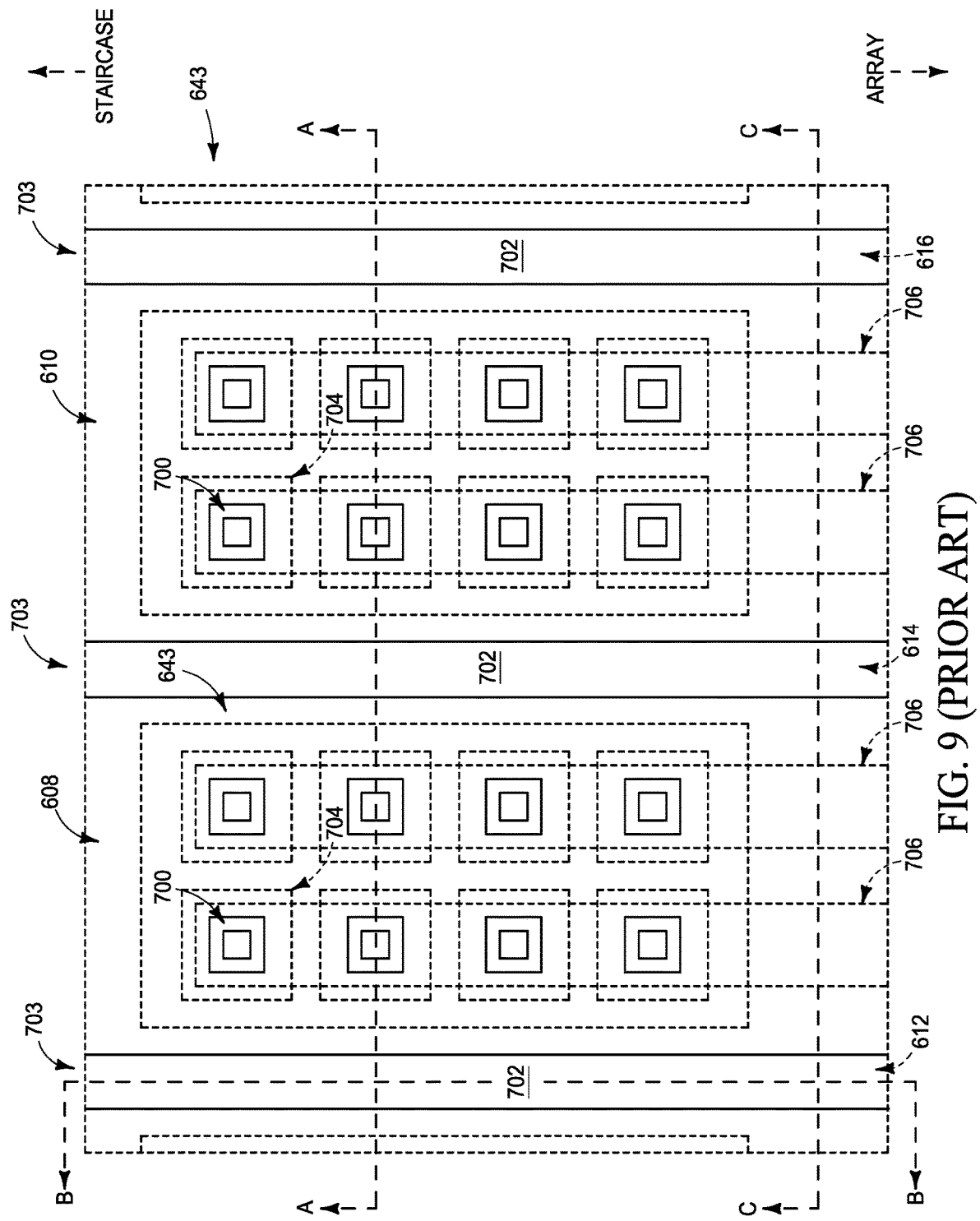
FIGS. 9-9C are views of regions of a conventional (prior art) assembly. The view of FIG. 9 is a diagrammatic top-down view. The views of FIGS. 9A-9C are diagrammatic cross-sectional side views along the lines A-A, B-B and C-C of FIG. 9, respectively.
Figure 10:
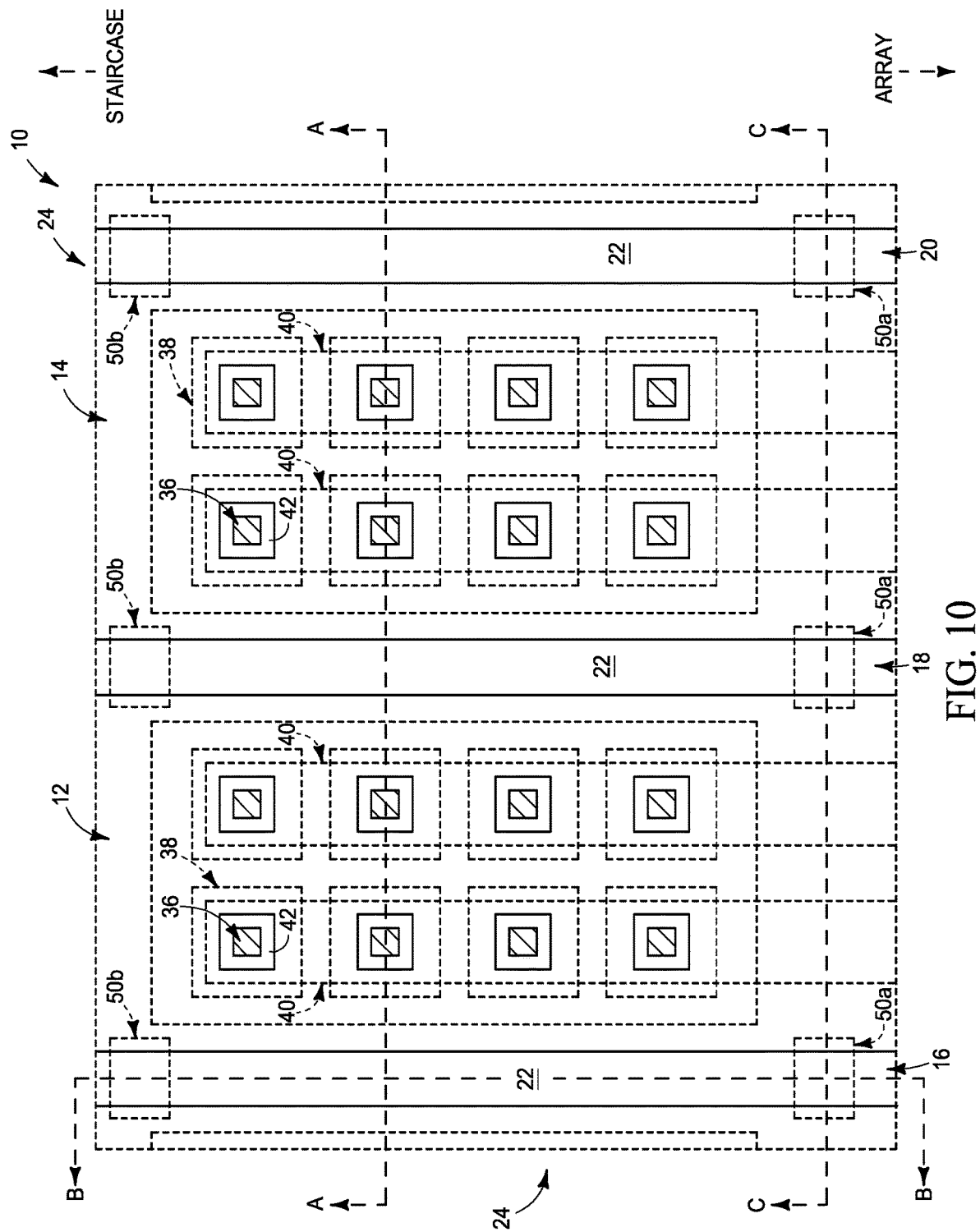
FIGS. 10-10C are views of regions of an example assembly in accordance with an example embodiment. The view of FIG. 10 is a diagrammatic top-down view. The views of FIGS. 10A-10C are diagrammatic cross-sectional side views along the lines A-A, B-B and C-C of FIG. 10, respectively.
Figure 10A:
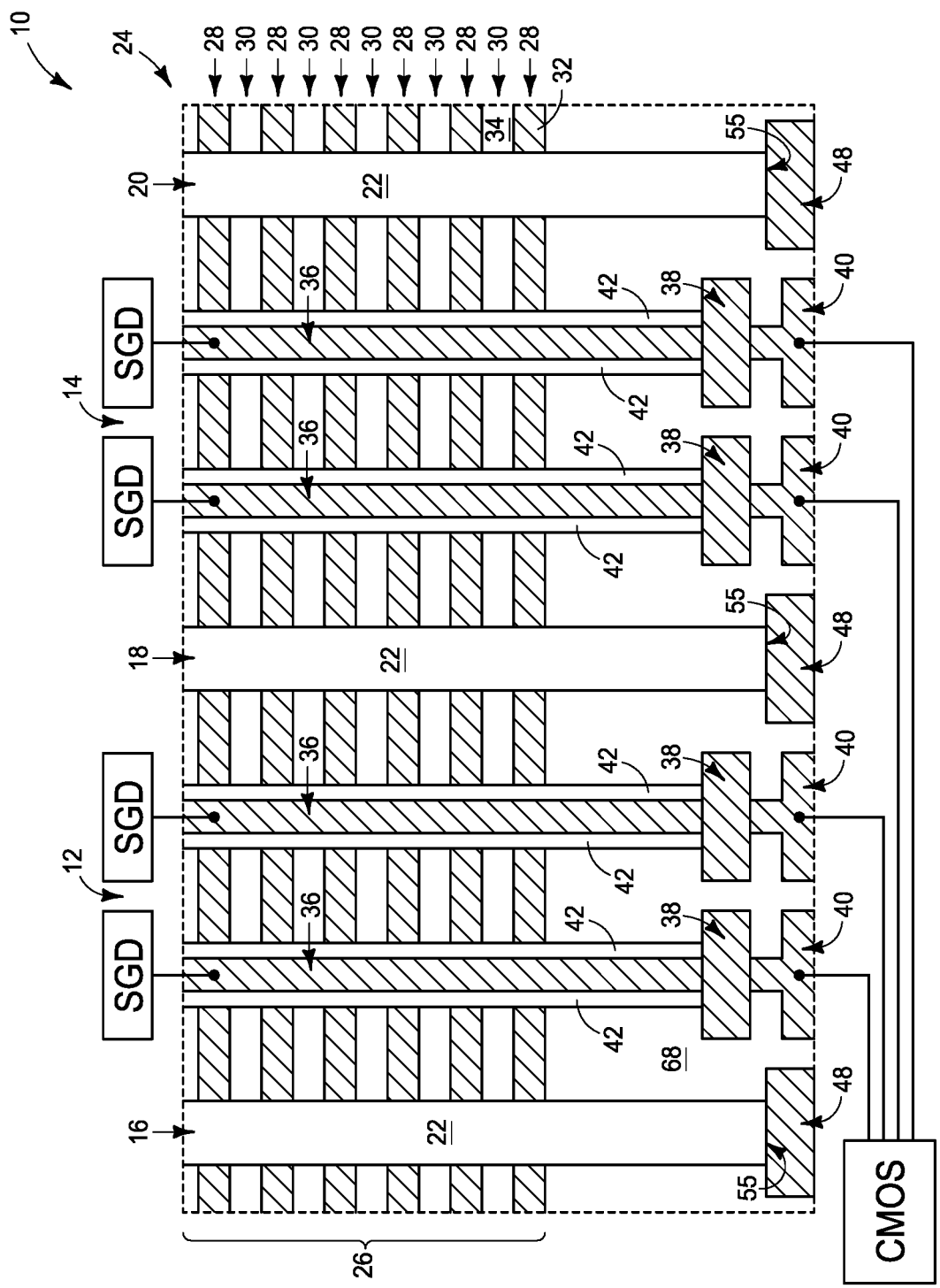
Figures 1, 10A:
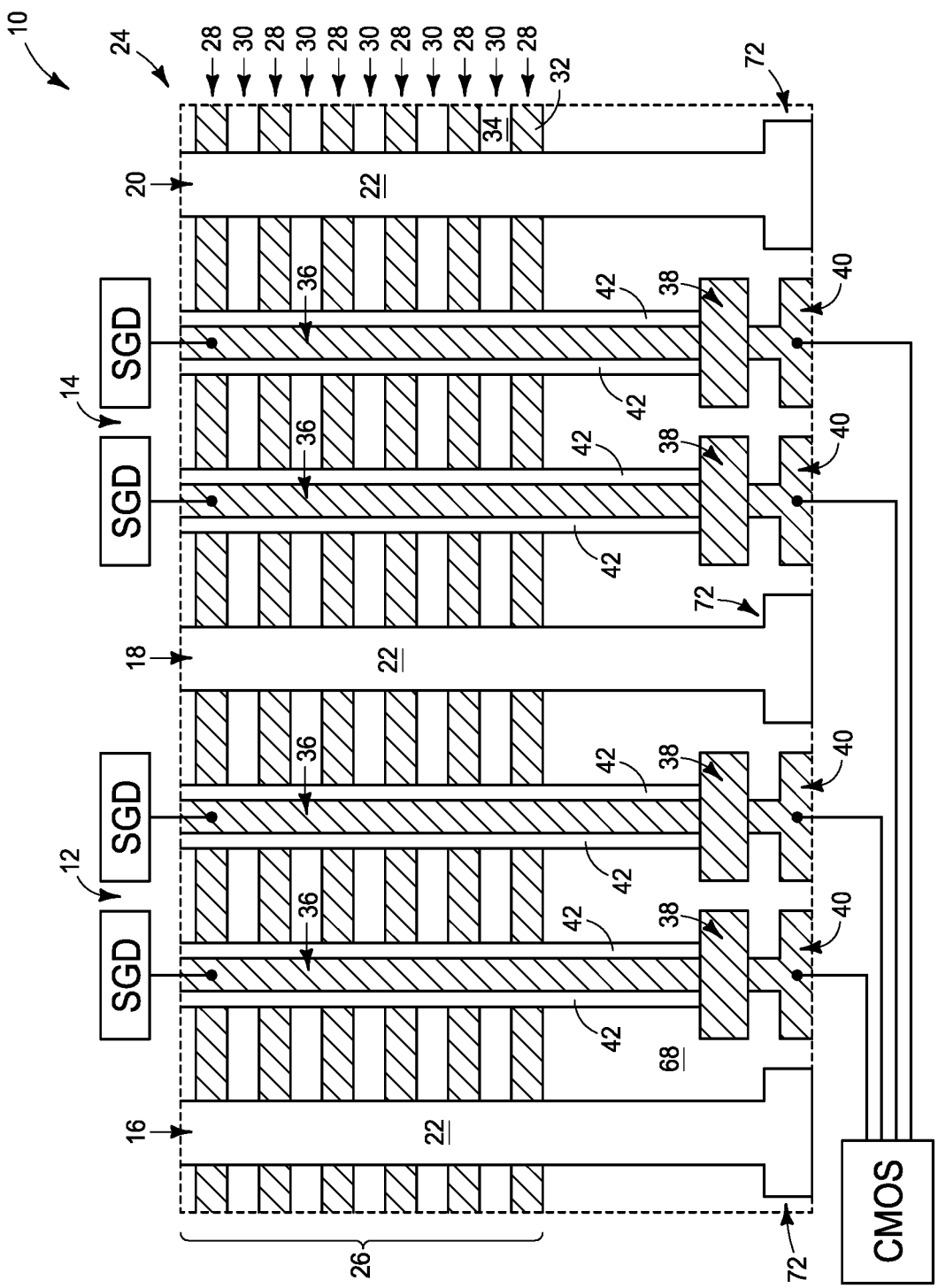
Figures 2, 10A:
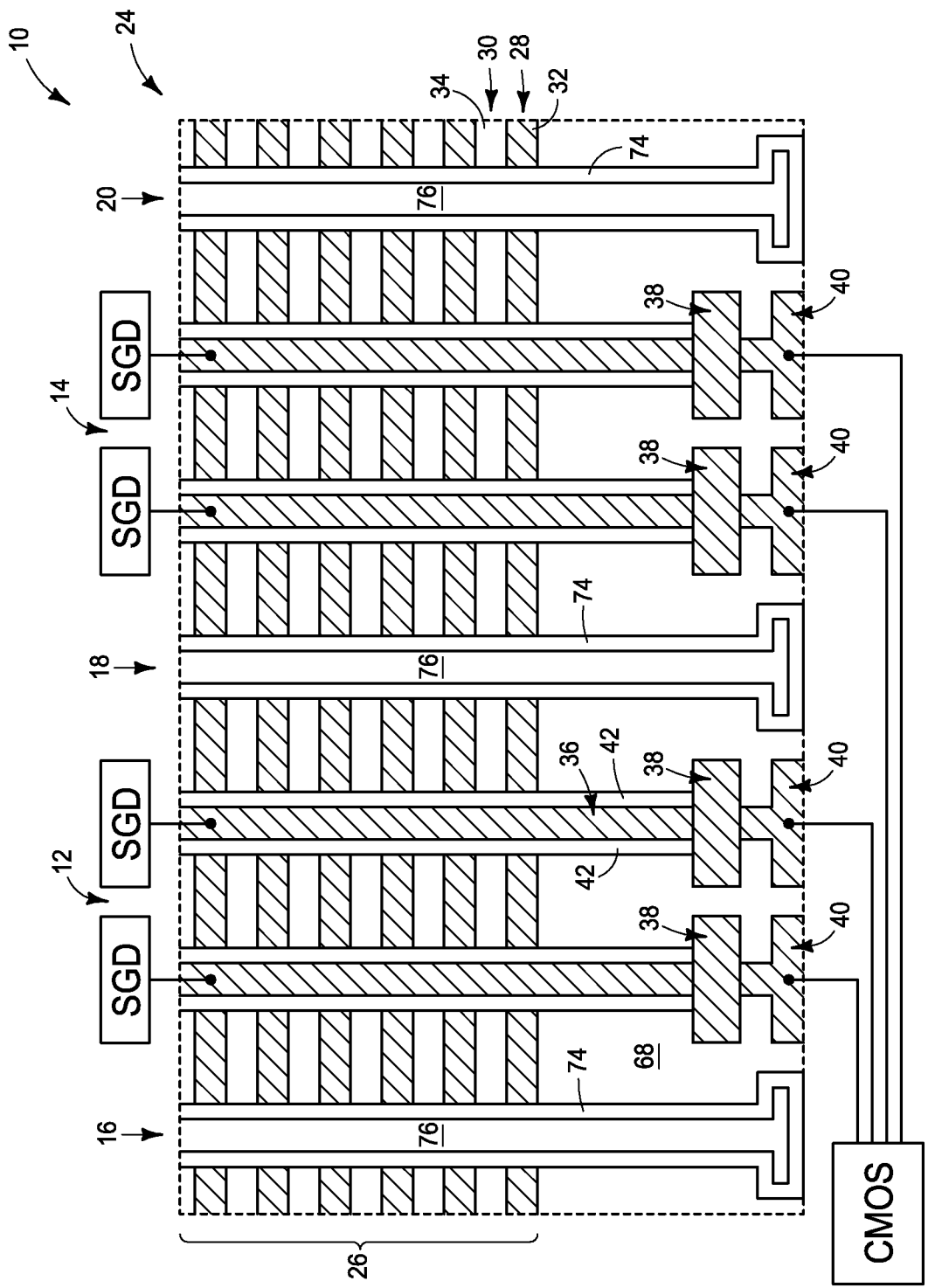
Figure 10B:
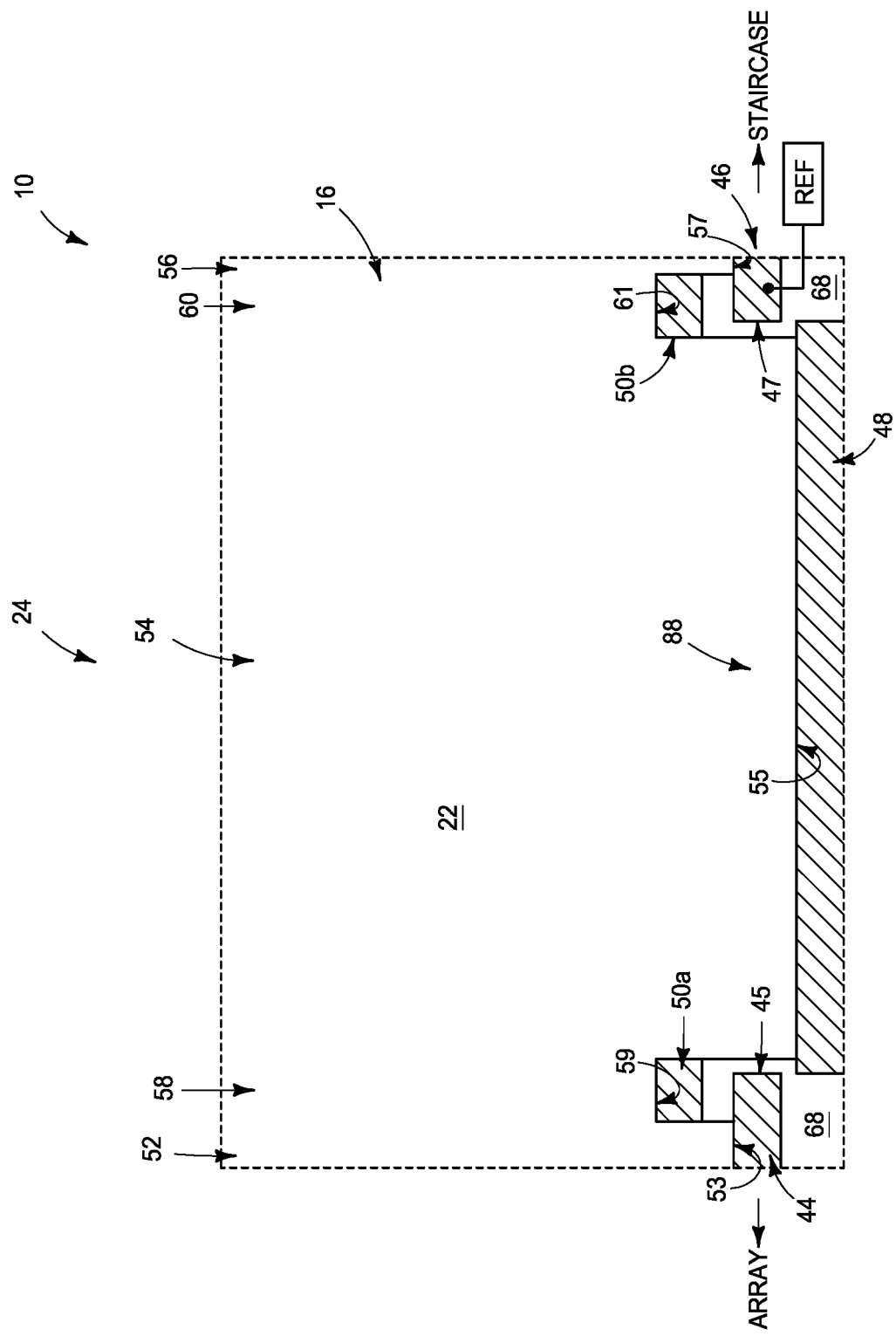
Figure 10C:
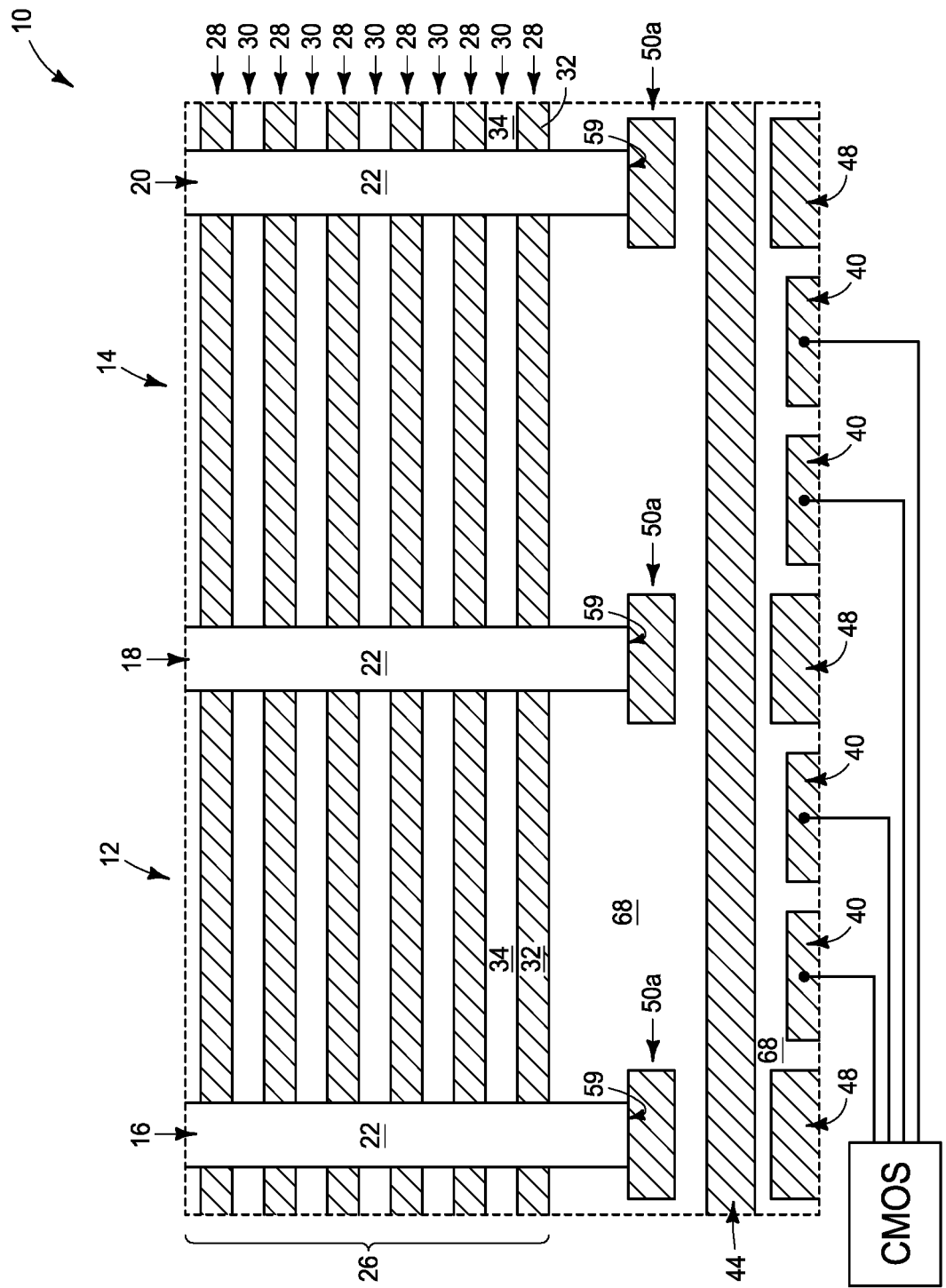

Referring to FIGS. 10-10C, an integrated assembly (architecture, construction, etc.) 10 includes a pair of memory block regions 12 and 14. The memory block regions 12 and 14 may be analogous to the regions 608 and 610 described above with reference to FIGS. 5-9.

Panels 16, 18 and 20 are provided within the assembly 10. The panel 18 spaces (separates) the memory block region 12 from the memory block region 14.

The panels 16, 18 and 20 comprise panel material 22. The panel material 22 may comprise any suitable composition(s). For instance, the panel material 22 may comprise, consist essentially of, or consist of silicon dioxide. Alternatively, the panel material 22 may comprise two more different compositions. For instance, the panel material 22 may comprise silicon (e.g., polysilicon) and silicon dioxide.

The illustrated portion of assembly 10 may be within a crest region 24 analogous to the crest region 643 described above with reference to FIG. 7. FIG. 10 shows that the illustrated region 24 may be between a memory array region (Array) and a staircase region (Staircase). In some embodiments, the memory array region may be referred to as a first region, and the region 24 of FIG. 10 may be referred to as a second region which is adjacent the memory array region. In some embodiments, the region 24 of FIG. 10 may be referred to as an interconnect region which is between the memory array region and the staircase region.

The memory array region may be identical to the array region 604 described above with reference to FIGS. 5 and 6; and accordingly may include channel material pillars extending through a stack of alternating conductive levels and insulative levels. FIGS. 10A and 10C show cross-sections along the lines A-A and C-C of FIG. 10, respectively; and show an example stack 26 of alternating conductive levels 28 and insulative levels 30. The stack 26 may be identical to the stack 622 described above with reference to FIG. 6.

The conductive levels 28 comprise conductive material 32. Such conductive material may be identical to the conductive material 628 described above with reference to FIG. 6. In some embodiments, the conductive material 32 may comprise a tungsten core and a metal-nitride-liner extending along an outer peripheral surface of the tungsten core. The metal-nitride liner may comprise, for example, tungsten nitride and/or titanium nitride. Also, high-k dielectric material (e.g., dielectric-barrier material) may extend along outer edges of the conductive levels 28 in some embodiments.

The insulative levels 30 comprise insulative material 34. Such insulative material may be identical to the insulative material 630 described above with reference to FIG. 6. In some embodiments, the insulative material 34 may comprise, consist essentially of, or consist of silicon dioxide.

The staircase region of FIG. 10 may be identical to the staircase region described above with reference to FIG. 8, and accordingly may comprise staggered terminal regions along the conductive levels 28; with such staggered terminal regions being analogous to the regions 648 of FIG. 8.

Figure 9A:
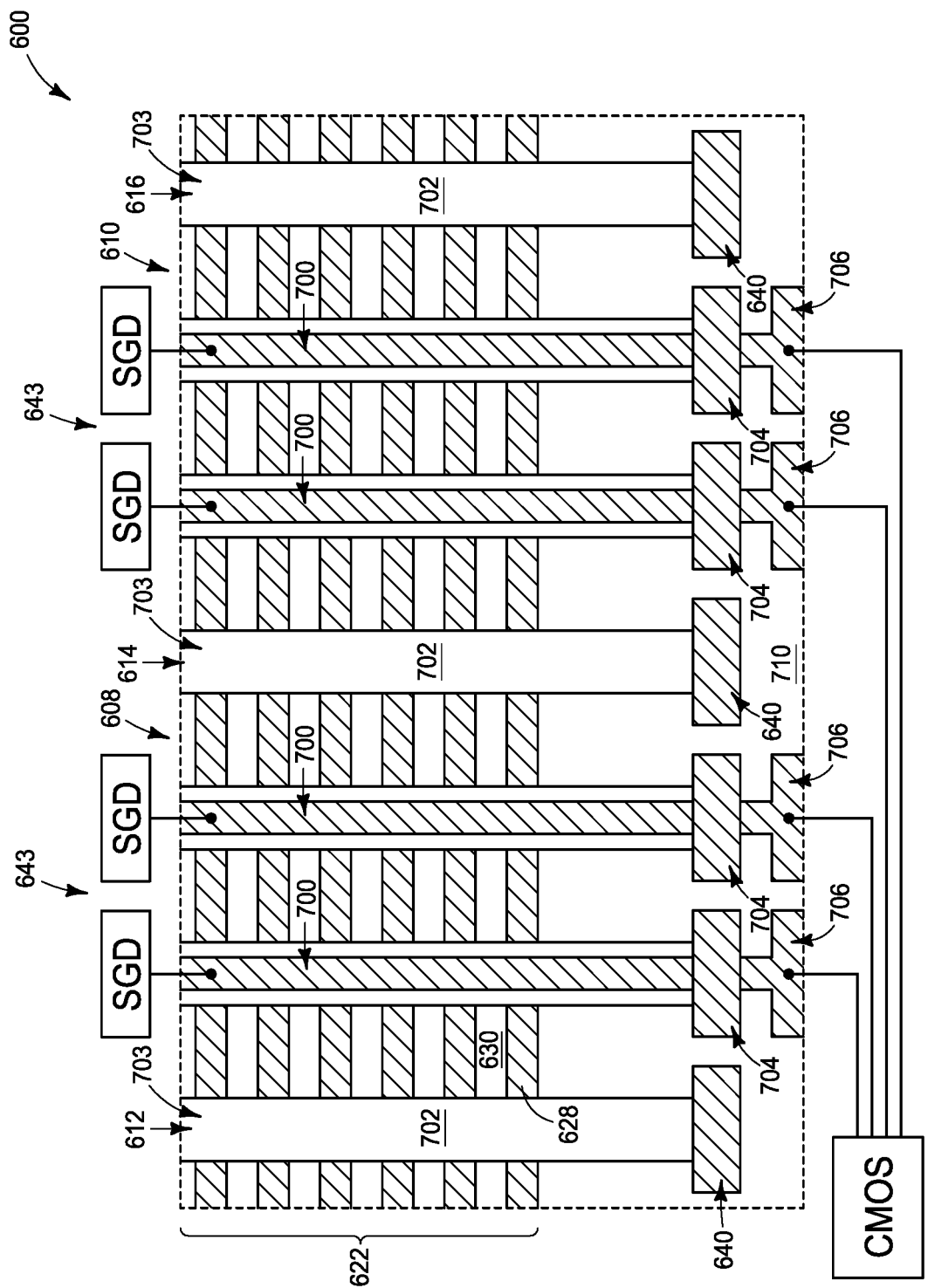
Figure 9B:
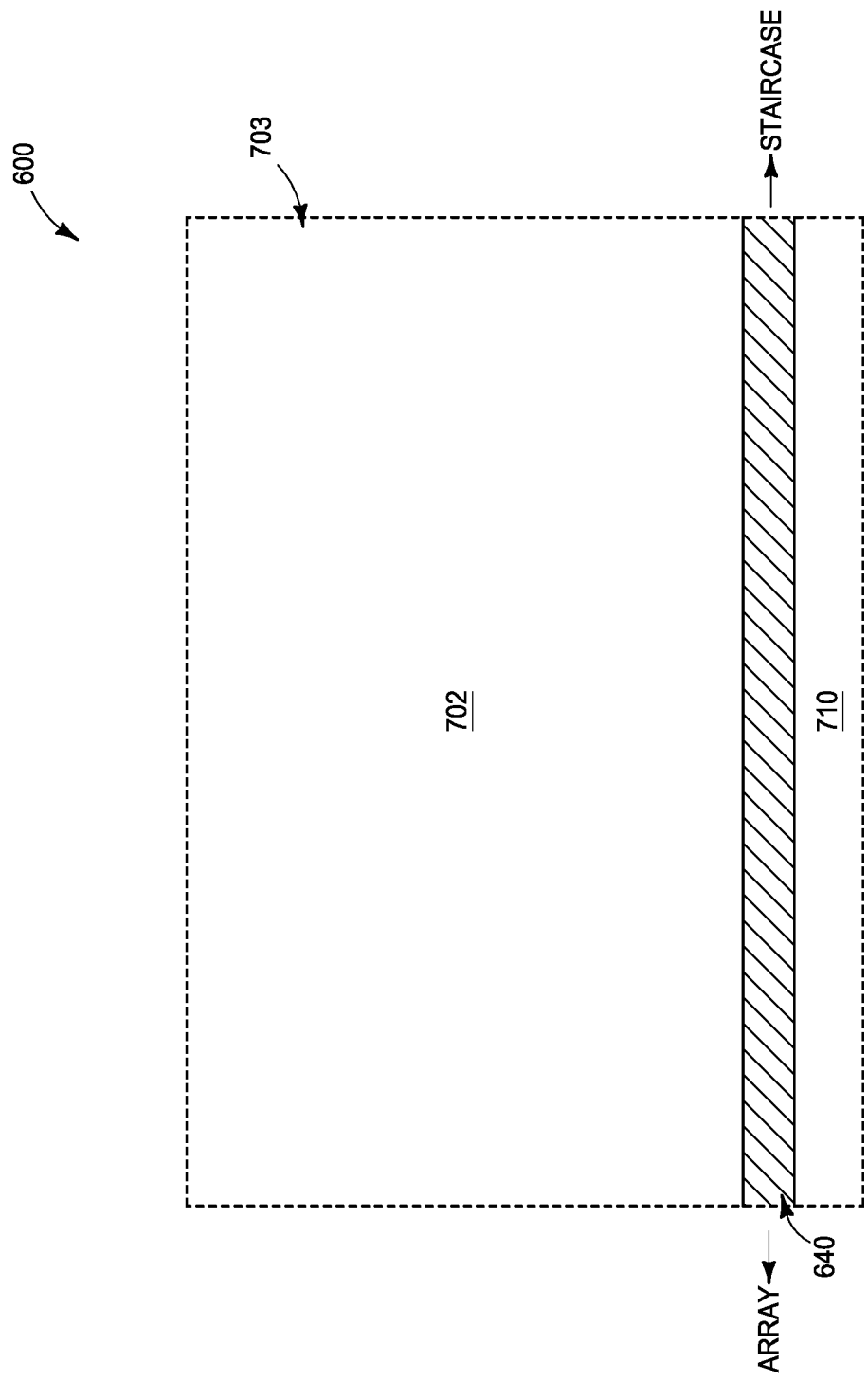
Figure 9C:
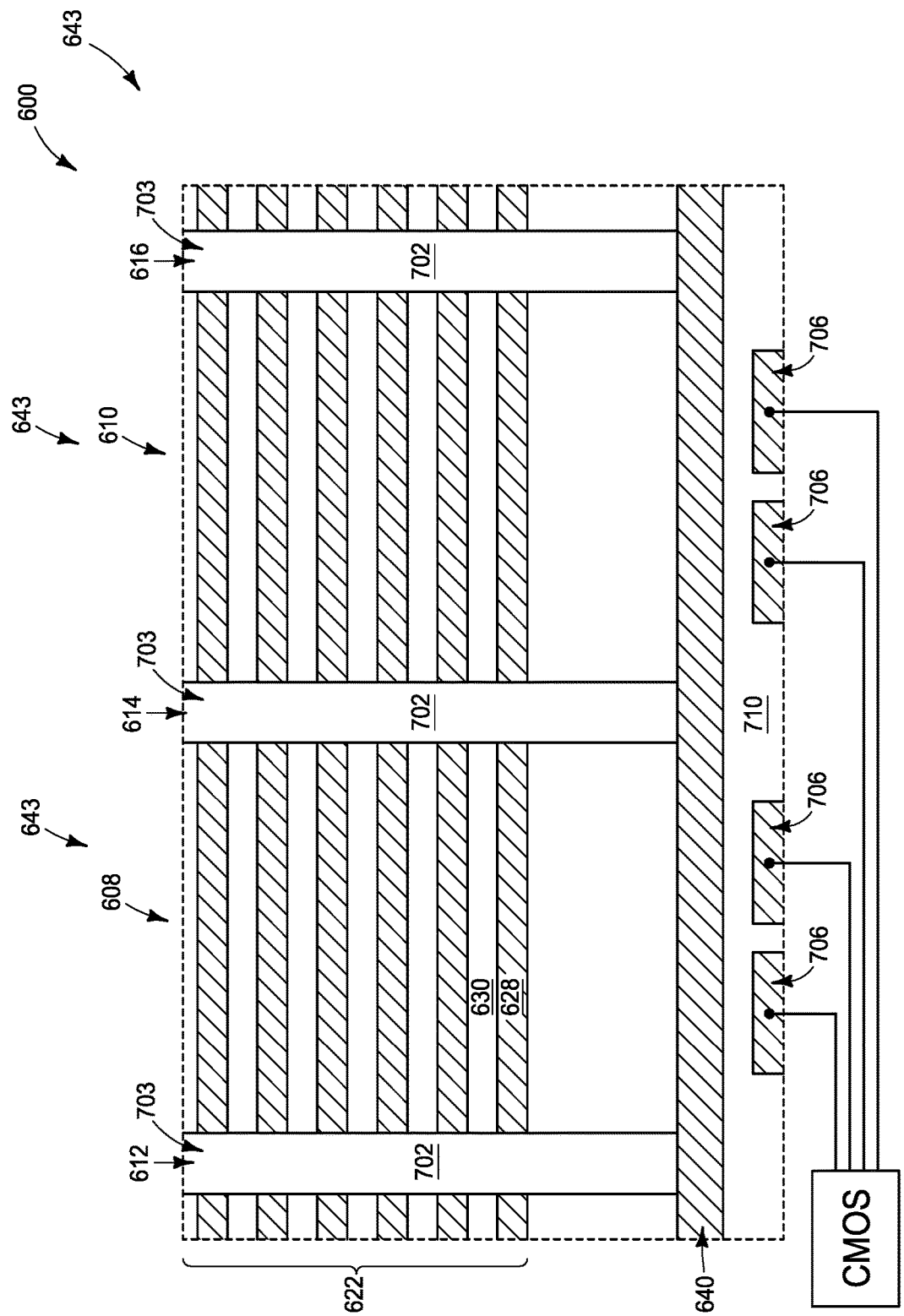

The configuration of FIGS. 10-10C is similar to that of FIGS. 9-9C in that it comprises interconnects 36 extending upwardly from conductive blocks 38. The interconnects 36 and conductive blocks 38 may be identical to the interconnects 700 and conductive blocks 704 shown in FIG. 9A. The interconnects 36 are shown extending to SGDs, but in other embodiments may extend to other circuitry associated with a memory array. The conductive blocks 38 are shown to be over conductive structures 40 which couple with CMOS, and/or other appropriate logic circuitry. The conductive structures 40 may be identical to the structures 706 shown in FIG. 9A. The blocks 38 and structures 40 are shown in dashed-line (phantom) view in FIG. 10 to indicate that they are beneath other materials.

The interconnects 36 are surrounded by insulative material 42 to electrically isolate the interconnects from the conductive material 32 of the conductive levels 28. The insulative material 42 may comprise any suitable composition(s); and in some embodiments may comprise, consist essentially of, or consist of silicon dioxide.

The conductive structures 36, 38 and 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, one or more of the conductive structures 36, 38 and 40 may comprise a same composition as another of the conductive structures 36, 38 and 40. In some embodiments, one or more of the conductive structures 36, 38 and 40 may comprise a different composition relative to others of the conductive structures 36, 38 and 40. In some embodiments, one or more of the conductive structures 36, 38 and 40 may comprise, consist essentially of, or consist of tungsten.

A source structure 44 is shown in FIG. 10C. The source structure 44 may be analogous to the source structure 640 described above with reference to FIG. 6, and may extend across a memory array to be coupled with channel material of channel material pillars. The source structure 44 is configured as a conductive expanse, and may comprise any suitable composition(s). In some embodiments, the source structure 44 may comprise conductively-doped semiconductor material over metal silicide; and may, for example, comprise conductively-doped silicon over WSi (where the chemical formula indicates primary constituents rather than a specific stoichiometry).

FIG. 10B shows a difference between the assembly 10 of the present invention relative to the assembly 600 of the prior art (shown in FIG. 9B). Specifically, FIG. 10B shows that the conductive expanse (source structure) 44 is cut in the crest region 24. Accordingly, the configuration of FIG. 10B comprises the expanse 44 as a first conductive expanse which extends to the memory array region (Array), and comprises a second conductive expanse 46 at the same elevational level as the first conductive expanse 44, and extending to the staircase region (Staircase). The first and second conductive expanses 44 and 46 may be portions of an initial conductive expanse analogous to the expanse 640 of FIG. 9B. However, in the prior art of FIG. 9B the conductive expanse 640 (source structure) extends entirely from the memory array region to the staircase region, and accordingly is at a same voltage across the memory region, the staircase region, and the crest region between the memory array region and the staircase region. In contrast, the expanse 44 (source structure) of FIG. 10B is at a voltage utilized for a memory array while the expanse 46 (which extends to the staircase region) may be electrically floating or may be coupled with any suitable reference voltage (REF); such as ground, VCC/2, etc.

A support structure 48 extends from the first conductive expanse 44 to the second conductive expanse 46. The support structure 48 is elevationally offset relative to the first and second conductive expanses. In the embodiment of FIG. 10B, the support structure 48 is beneath the conductive expanses 44 and 46.

The support structure 48 may comprise any suitable composition(s); and may be electrically conductive, insulative or semiconductive. In some embodiments, it may be advantageous for the support structure 48 to comprise the same material as the conductive structures 40 (shown in FIG. 10A) so that the support structure 48 and the conductive structures 40 may be fabricated at the same time from the same material. Accordingly, it may be advantageous for the support structure 48 to comprise, consist essentially of, or consist of tungsten. FIGS. 10A and 10C show that the support structure 48 of FIG. 10B may be one of several support structures, with each of such support structures being under one of the panels 16, 18 and 20. In the illustrated embodiment, the support structures 48 are formed at a same elevational level as the conductive structures 40. In other embodiments, the support structures 48 may be formed at other elevational levels, either above or below uppermost surfaces of the conductive structures 40. In some embodiments, the support structures 48 may comprise a different composition than one or both of the expanses 44 and 46. For instance, in some embodiments the support structures 48 may comprise, consist essentially of or consist of tungsten; and the expanses 44 and 46 may comprise conductively-doped semiconductor material (e.g. silicon) over metal silicide (e.g. tungsten silicide).

FIG. 10B shows protecting structures 50 formed directly above edges 45 and 47 of the conductive expanses 44 and 46. The illustrated protecting structures are labeled as 50a and 50b so that they may be distinguished relative to one another. The protecting structures 50a and 50b may be referred to as first and second protecting structures, respectively.

The protecting structures 50 may protect the edges 45 and 47 of the first and second expanses 44 and 46 from damage during formation of the panels 16, 18 and 20.

The protecting structures 50 may comprise any suitable composition(s); and may be electrically conductive, electrically insulative, or semiconductive. In some embodiments the protecting structures 50 may comprise a same composition as the support structures 48; and may, for example, comprise, consist essentially of, or consist of one or more metals (e.g., tungsten).

The panel 16 of FIG. 10B may be considered to have a first portion 52 supported by a region of the first conductive expanse 44, a second portion 54 supported by the support structure 48, and a third portion 56 supported by the conductive expanse 46. The second portion 54 may be considered to be adjacent the first and third portions 52 and 56.

The first, second and third portions 52, 54 and 56 comprise bottom surfaces 53, 55 and 57, respectively. The bottom surfaces 53, 55 and 57 are directly against (or at least adjacent) upper surfaces of the structures 44, 48 and 46, respectively. In some embodiments, the panel 16 may comprise, consist essentially of, or consist of silicon dioxide, and such silicon dioxide may be directly against upper surfaces of the structures 44, 48 and 46.

The bottom surface 55 of the second portion 54 is elevationally offset relative to the bottom surfaces 53 and 57 of the first and third portions 52 and 56; and in the shown embodiment is below the bottom surfaces 53 and 57. The surface 55 may be elevationally offset from the surfaces 53 and 57 by any suitable distance; and in some embodiments may be elevationally offset by distance within a range of from about 10 nanometers (nm) to about 500 nm.

The panel 16 of FIG. 10B also has a fourth portion 58 over the first protecting structure 50a, and a fifth portion 60 over the second protecting structure 50b. The fourth and fifth portions 58 and 60 have bottom surfaces 59 and 61, respectively. The bottom surfaces 59 and 61 are above the bottom surfaces 53 and 57 of the first and third portions (58 and 60) of the panel 16.

In some embodiments, the bottom surfaces 53, 55, 57, 59 and 61 may be considered to be segments of the overall bottom surface of the panel 16.

In the illustrated embodiment, insulative material 68 is under the protecting structures 50a and 50b. The insulative material 68 may comprise any suitable composition(s); and in some embodiments may comprise, consist essentially of, or consist of silicon dioxide. The insulative material 68 may be identical to the material 710 described above with reference to FIGS. 9-9B.

The structures 40 and 48 may have different vertical thicknesses relative to one another (as shown in FIG. 10A) or may comprise the same vertical thickness as one another. Also, the structures 40 and 48 may comprise the same composition as one another, or may comprise different compositions relative to one another.

Figure 1:
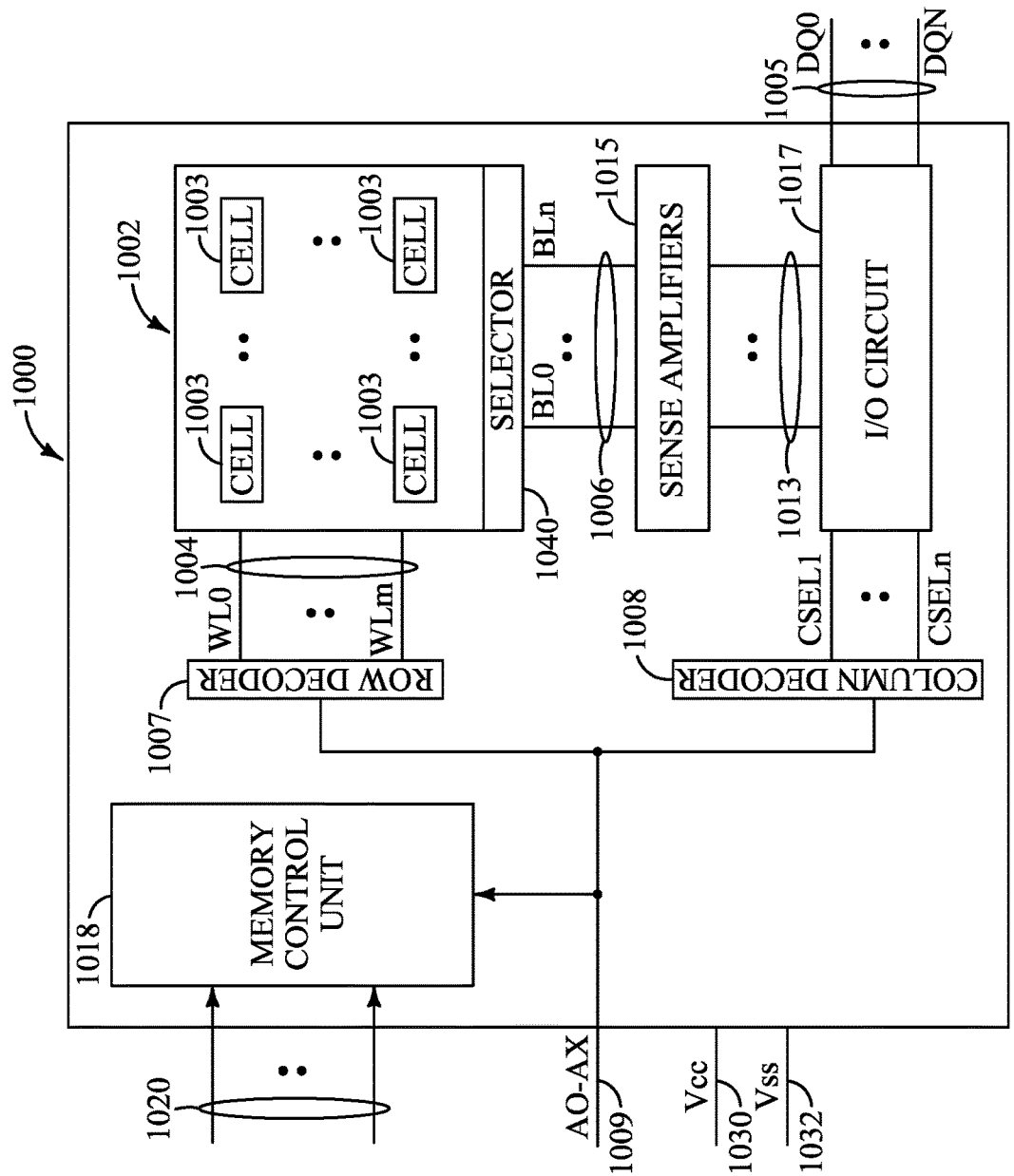
FIG. 1 shows a block diagram of a prior art memory device having a memory array with memory cells.

FIG. 10A-1 shows an embodiment similar to that of FIG. 10, but in which the support structures 48 have been removed during formation of the panel material 22. Accordingly, the panel material 22 fills the regions occupied by the support structures 48 in the embodiment of FIG. 10A. The panels 16, 18 and 20 have wide bottom regions 72 corresponding to regions where the support structures 48 are shown in the embodiment of FIG. 10A.

Figure 2:
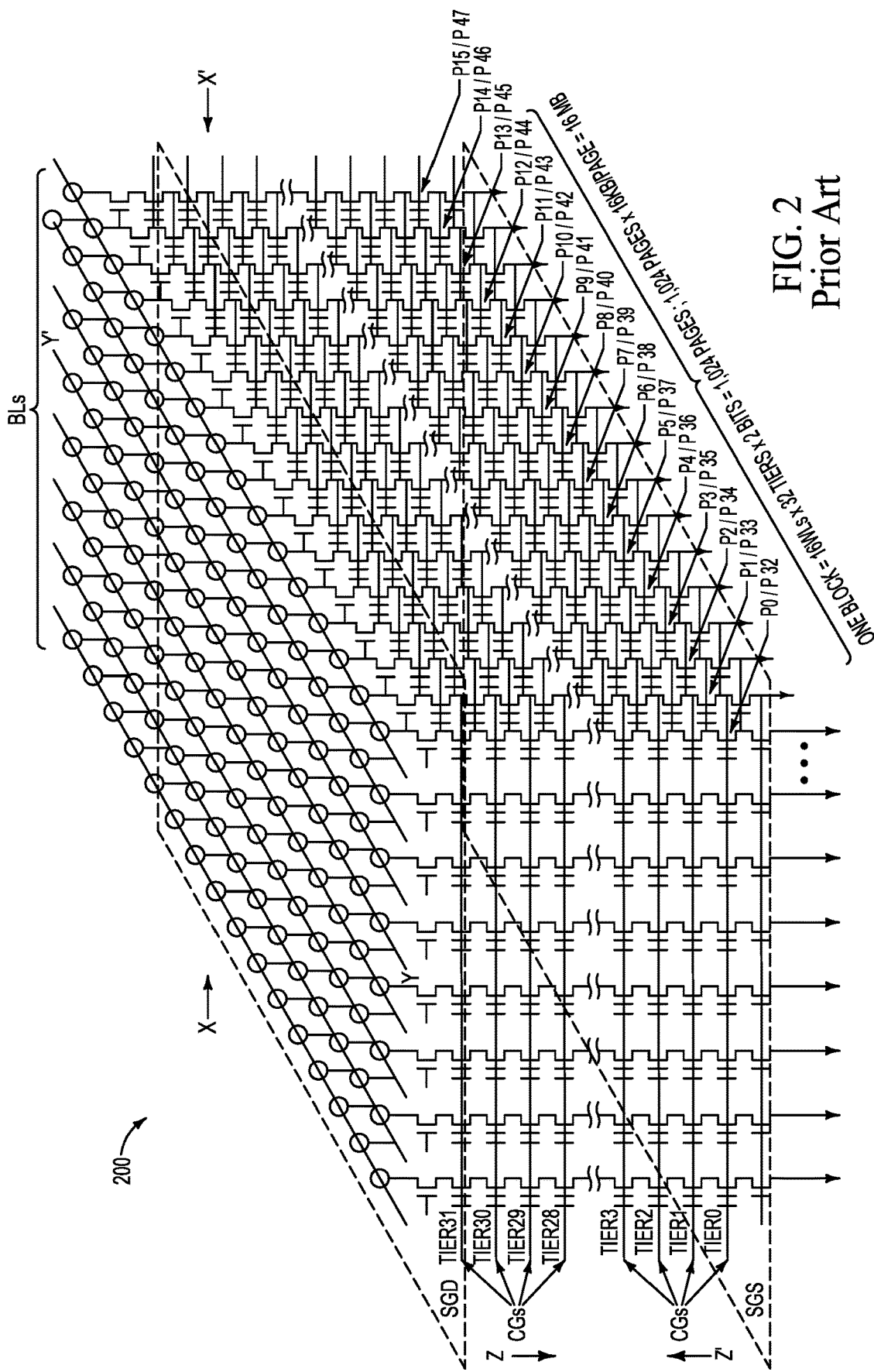
FIG. 2 shows a schematic diagram of the prior art memory device of FIG. 1 in the form of a 3D NAND memory device.
Figure 3:
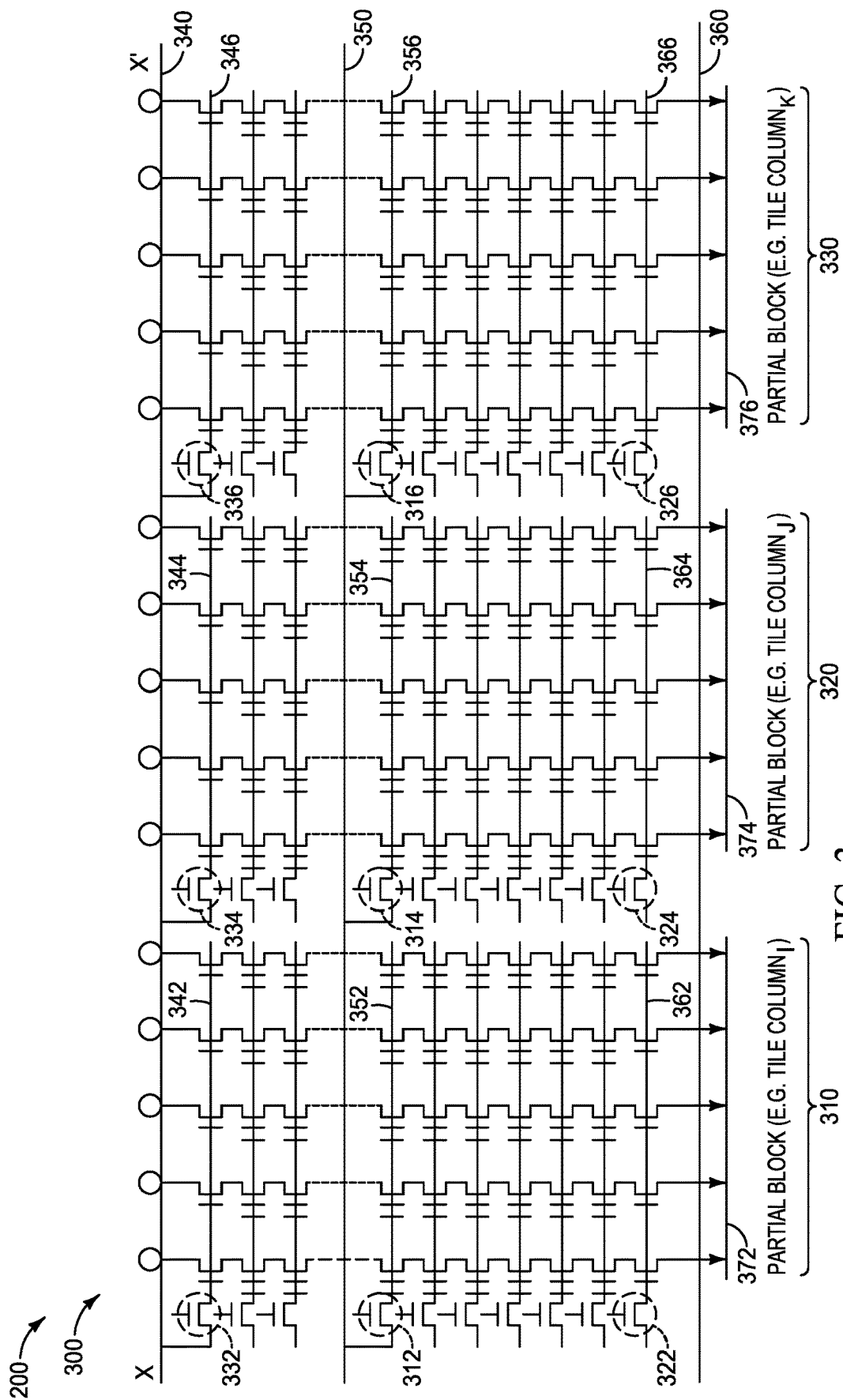
FIG. 3 shows a cross-sectional view of the prior art 3D NAND memory device of FIG. 2 in an X-X' direction.
Figure 4:
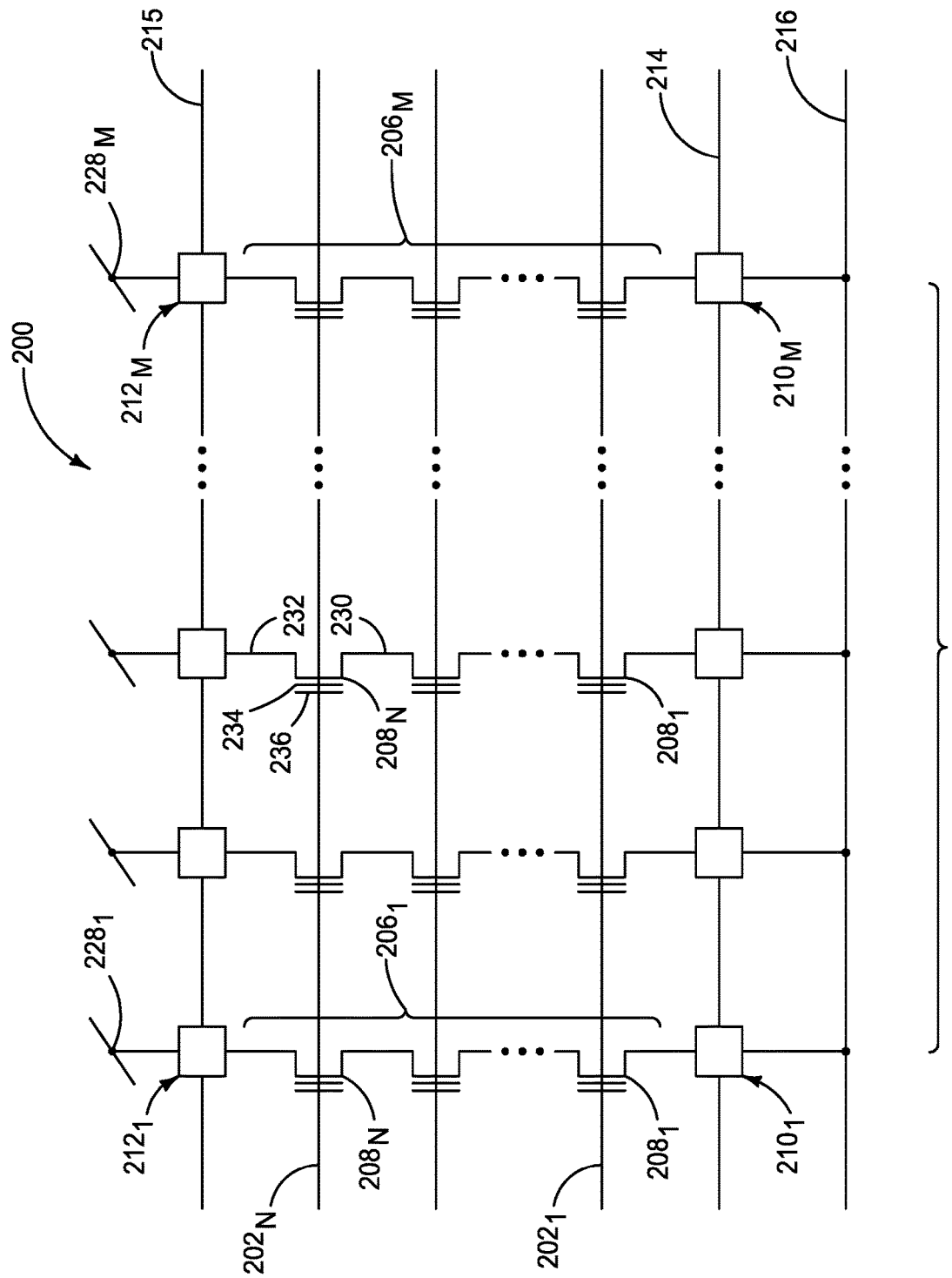
FIG. 4 is a schematic diagram of a prior art NAND memory array.
Figure 5:
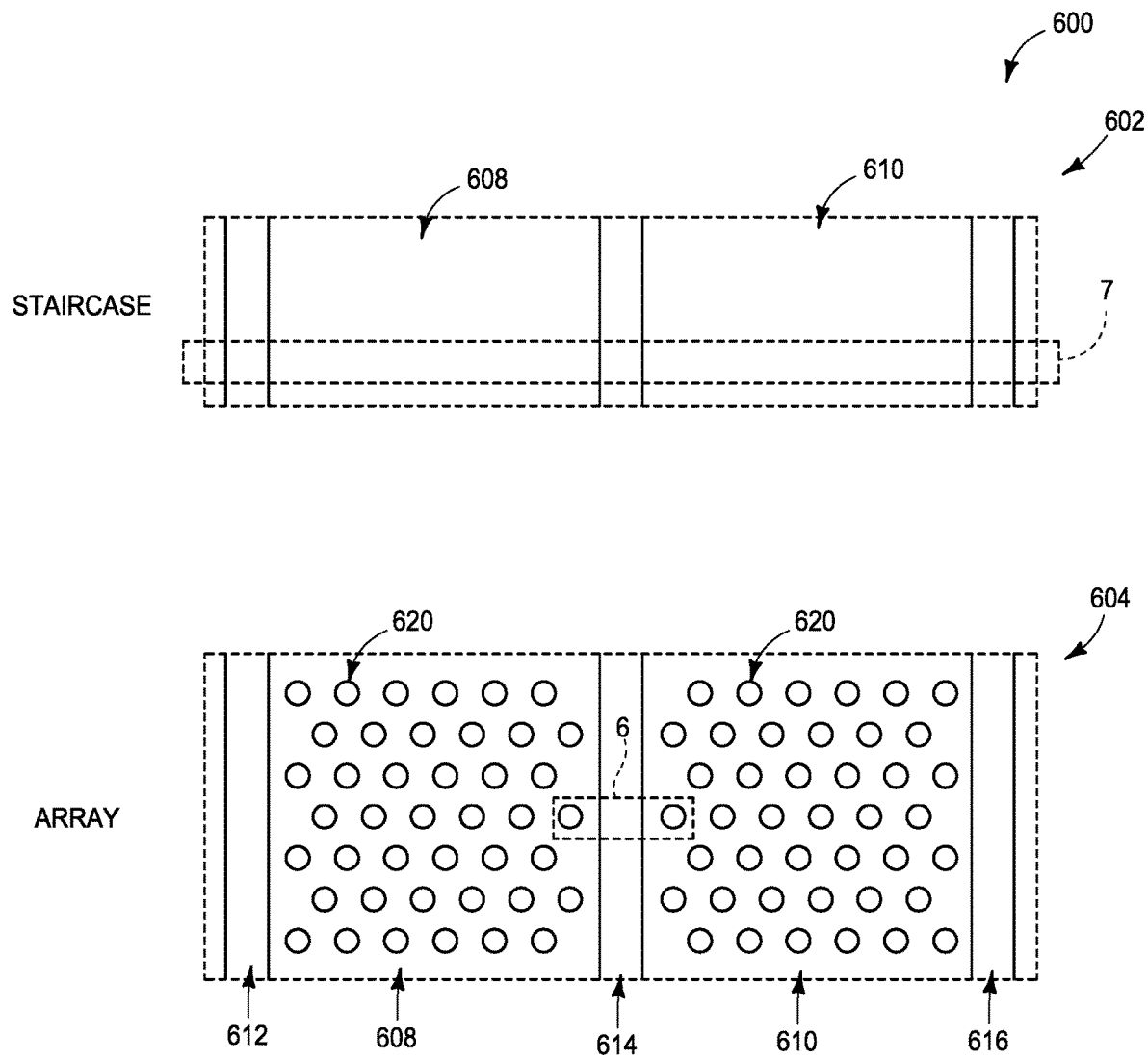
FIG. 5 is a diagrammatic top-down view of a prior art integrated assembly showing a staircase region and a memory array region associated with a semiconductor die.
Figure 6:
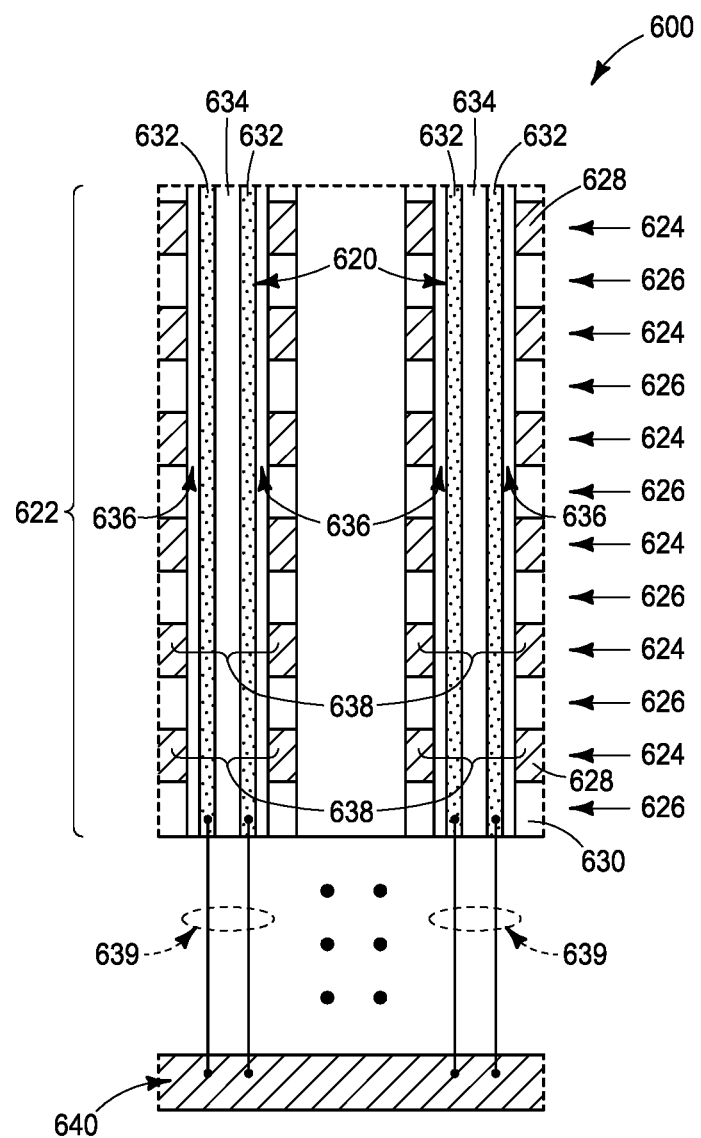
FIG. 6 is a diagrammatic cross-sectional side view along a region "6" of the prior art integrated assembly of FIG. 5.
Figure 7:
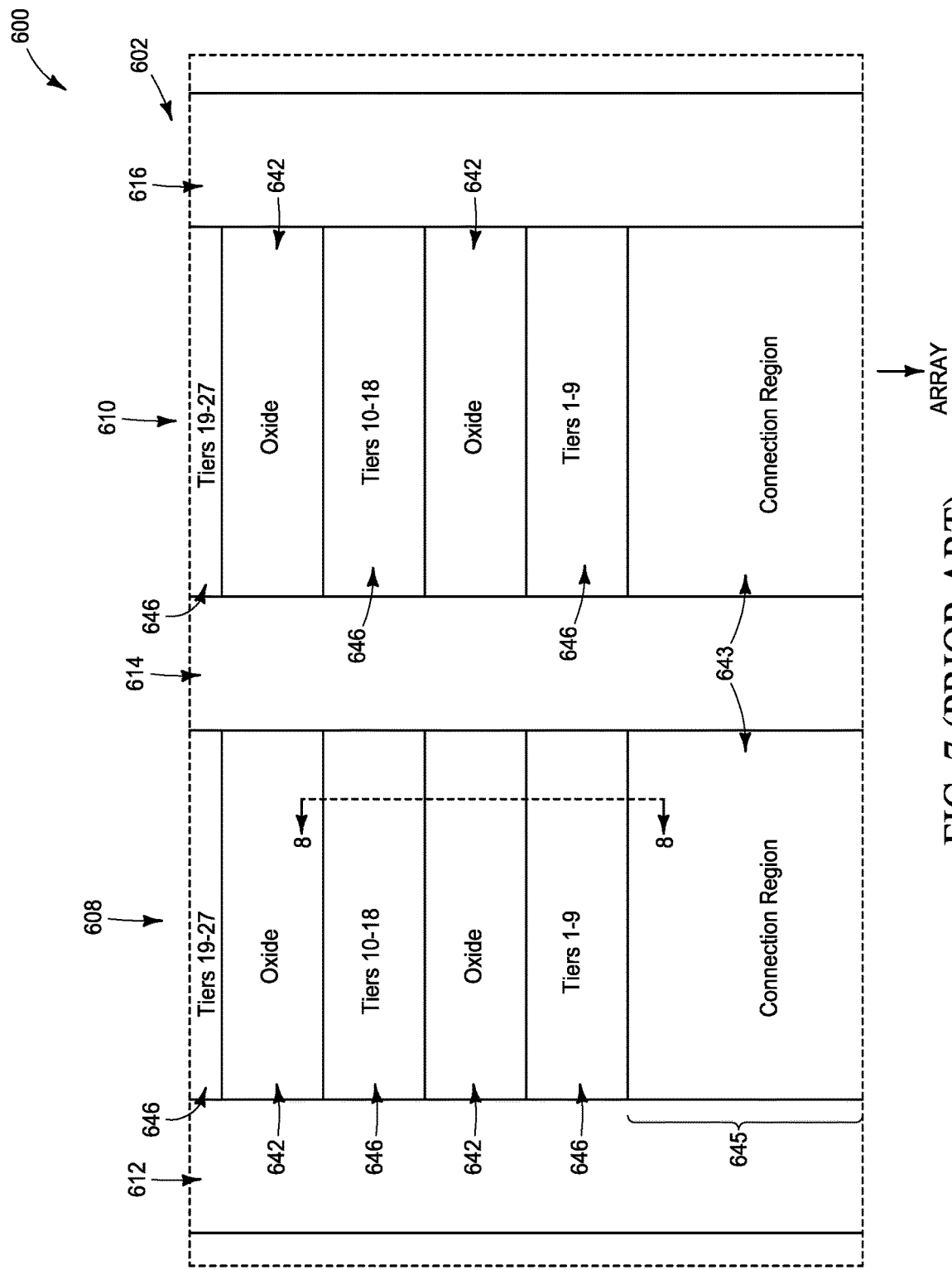
FIG. 7 is a diagrammatic top-down view along a region "7" of the prior art integrated assembly of FIG. 5.

FIG. 10A-2 shows an embodiment similar to that of FIG. 10A-1, but shows each of the panels 16, 18 and 20 comprising two different materials 74 and 76. The materials 74 and 76 may comprise any suitable compositions. In some embodiments, the material 74 may comprise, consist essentially of, or consist of silicon dioxide; and the material 76 may comprise, consist essentially of, or consist of silicon. The silicon may be in any suitable crystalline form (e.g., amorphous, polycrystalline, monocrystalline); and in some embodiments may be referred to as polysilicon (with polysilicon generally comprising one or both of amorphous and polycrystalline forms of silicon).

Figure 11:
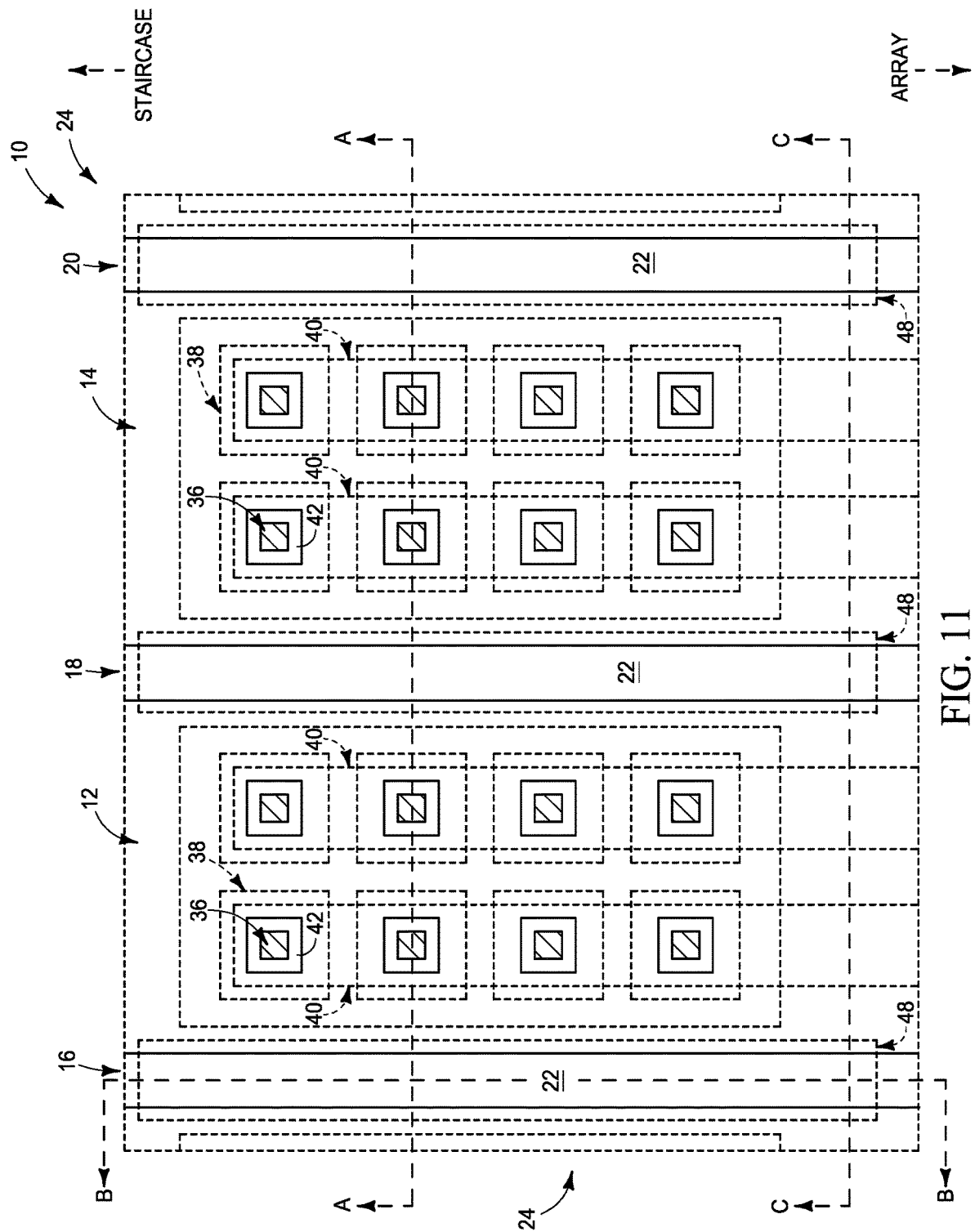
FIGS. 11-11C are views of regions of an example assembly in accordance with an example embodiment. The view of FIG. 11 is a diagrammatic top-down view. The views of FIGS. 11A-11C are diagrammatic cross-sectional side views along the lines A-A, B-B and C-C of FIG. 11, respectively.
Figure 11A:
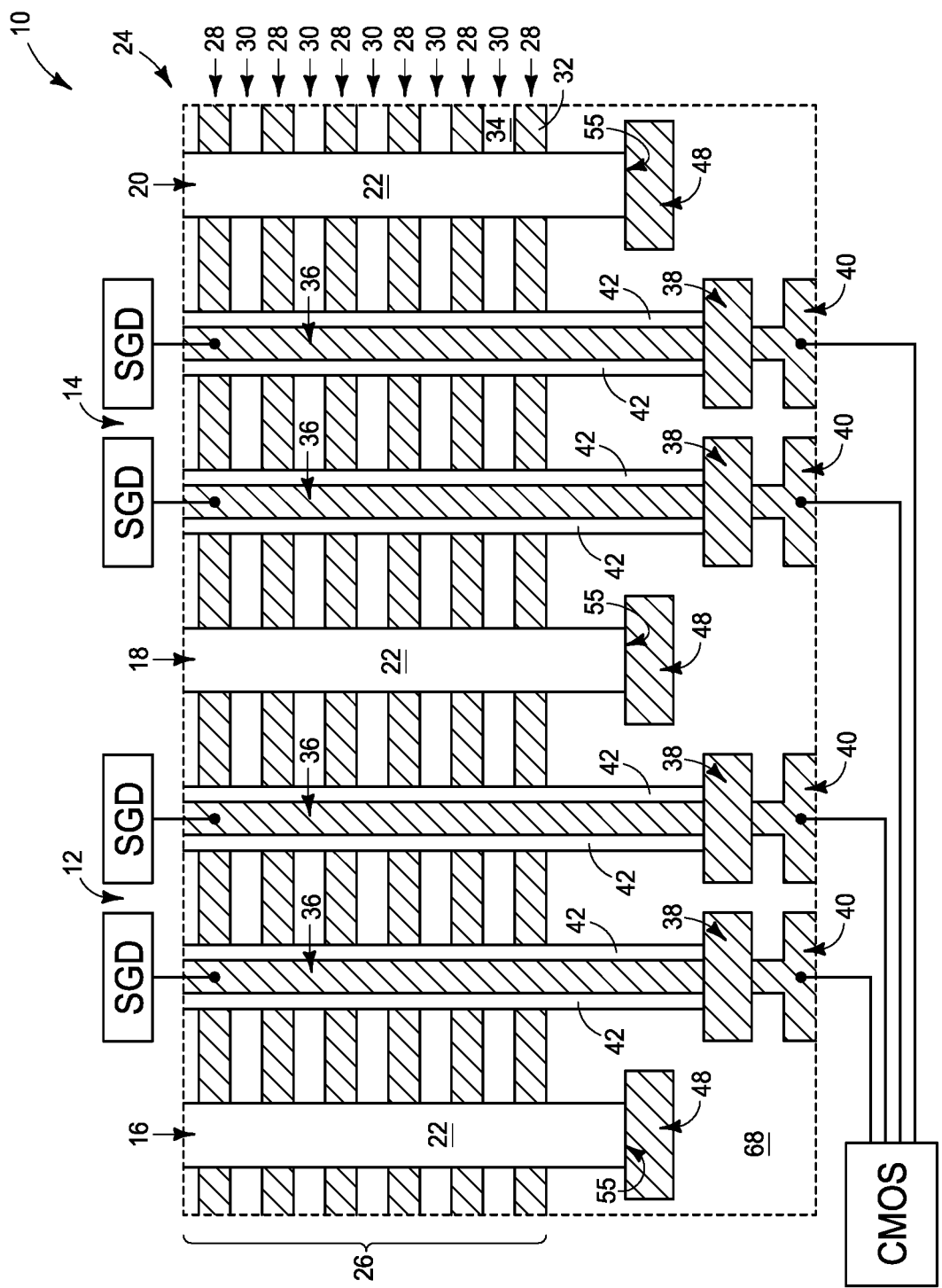
Figures 1, 11A:
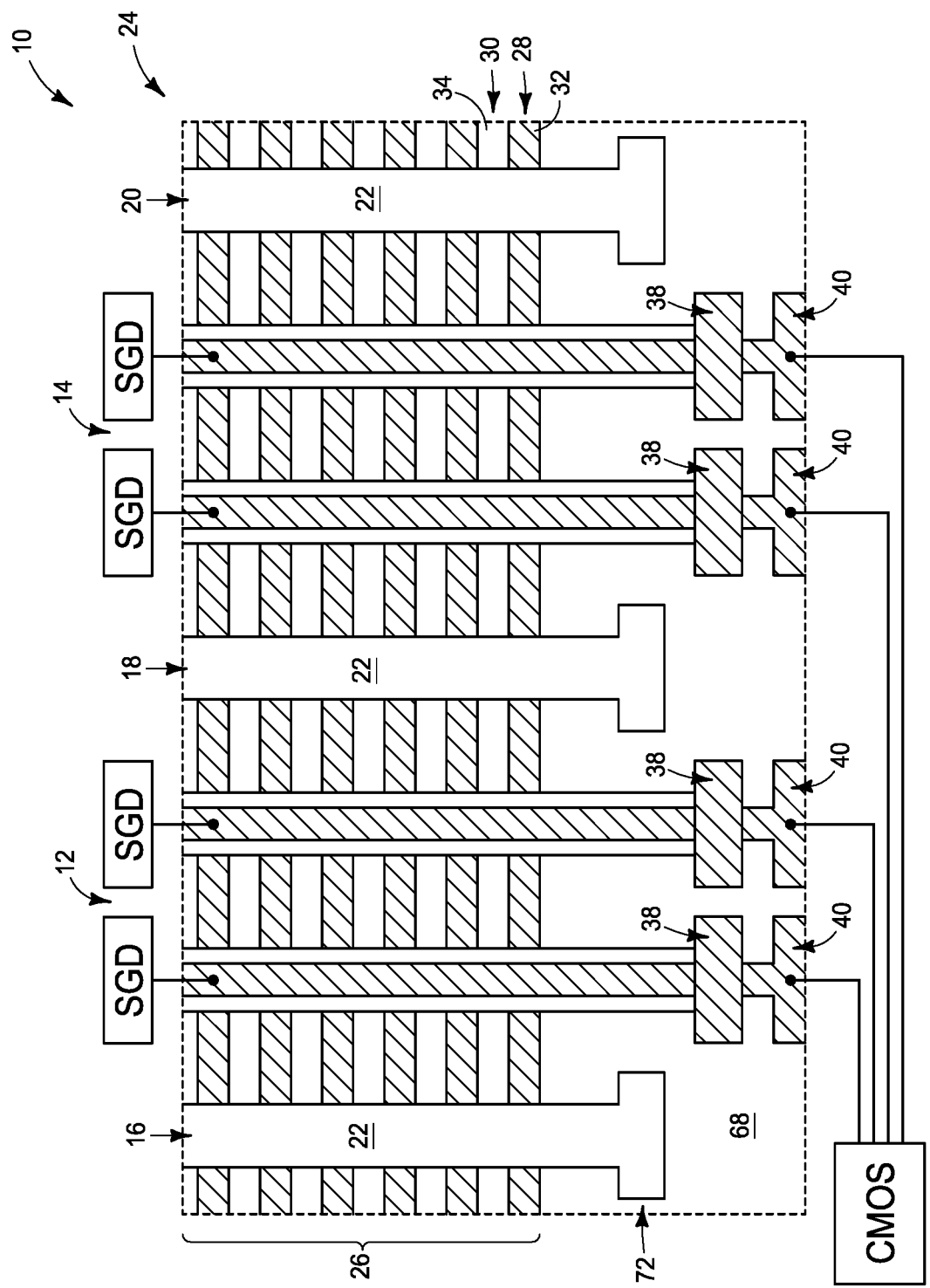
Figures 2, 11A:
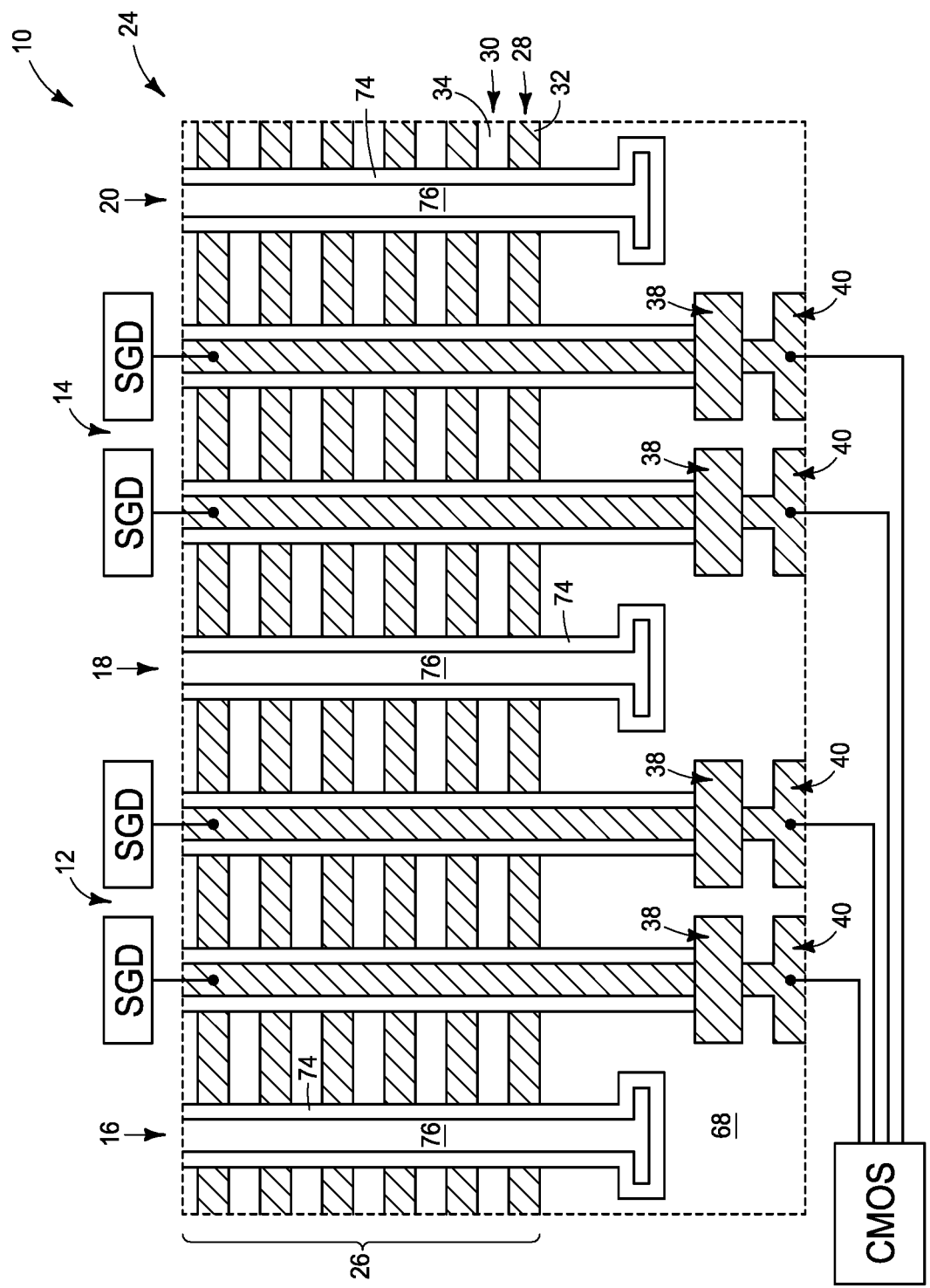
Figure 11B:
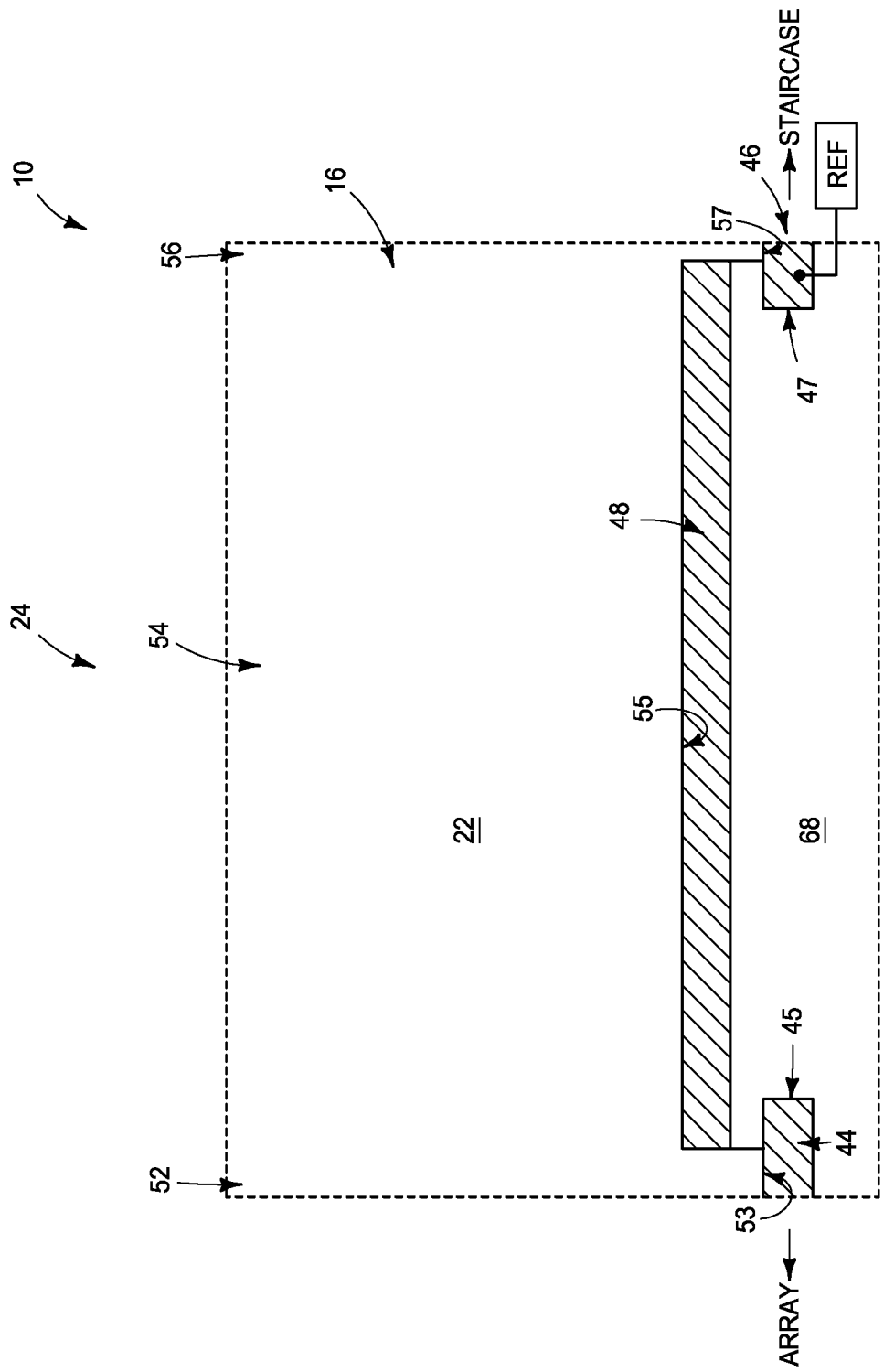
Figure 11C:
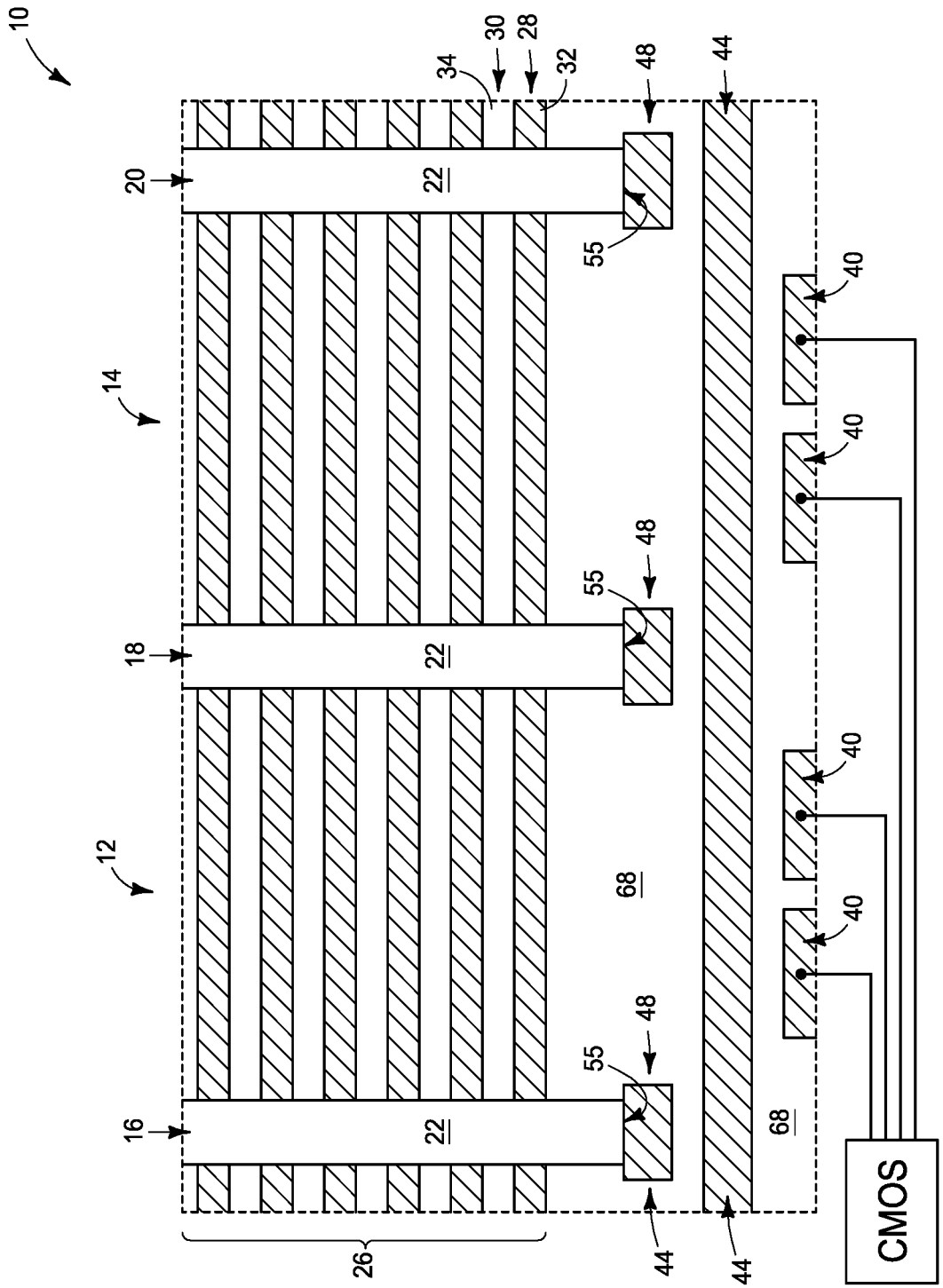

Referring to FIGS. 11-11C, an embodiment similar to that of FIGS. 10-10C is shown. However, the embodiment of FIGS. 11-11C has the support structures 48 at an elevational level above the elevational level of the conductive expanses 44 and 46. Accordingly, FIG. 11B shows that the bottom surface 55 of the second region of the panel 16 is above the bottom surfaces 53 and 57 of the first and third portions 52 and 56 of the panel 16. The bottom surface 55 may be above the bottom surfaces 53 and 57 by any suitable amount; and in some embodiments may be above the bottom surfaces 53 and 57 by an amount within a range of from about 10 nm to about 500 nm.

FIGS. 11A-1 and 11A-2 show embodiments analogous to those of FIGS. 10A-1 and 10A-2, but are based on the configuration of FIG. 11A rather than the configuration of FIG. 10A.

The embodiments described above with reference to FIGS. 10-10C, 10A-1, 10A-2, 11-11C, 11A-1 and 11A-2 may advantageously eliminate the problems described above with reference to FIG. 9A. Specifically, the conductive expanse (source structure) associated with a memory array (i.e., the conductive expanse 640 of FIG. 9A and 44 of FIGS. 10-10C, 10A-1 and 10A-2, 11-11C, 11A-1 and 11A-2) is proximate to conductive blocks 704 in conventional assemblies (e.g., the assemblies of FIGS. 9-9C), and is not proximate to analogous conductive blocks 38 in the embodiments of FIGS. 10-10C, 10A-1, 10A-2, 11-11C, 11A-1 and 11A-2. Embodiments described herein may eliminate problematic risks associated with conventional configurations. An example problematic risk that may be eliminated is the risk of shorting from the conductive expanse of the source material to the conductive blocks within the crest region. Another example problematic risk that may be eliminated is the risk of parasitic capacitance between the conductive expanse of source material to the conductive blocks within the crest region. Elimination of the shorting and/or of parasitic capacitance may eliminate, or at least alleviate, problematic leakage from SGD (or other circuitry coupled with the interconnects 36).

Another advantage of embodiments described herein may be that stresses associated with the tight packing at the elevational level of the conductive blocks 38 may be reduced since the expanse 44 is not along the same level as the conductive blocks.

The configurations of the embodiments of FIGS. 10-10C, 10A-1, 10A-2, 11-11C, 11A-1 and 11A-2 should be readily transferable to existing process flows; particularly if the additional structures (e.g., 48) are formed at elevational levels currently utilized for fabrication of other components (e.g., the conductive structures 40).

The embodiments described herein may enable processing constraints to be relaxed relative to conventional approaches since the risk of shorting from conductive blocks to a source structure in a crest region (interconnect region) is largely eliminated. Such may reduce costs and improve scalability.

The structures described above with reference to FIGS. 10-10C, 10A-1, 10A-2, 11-11C, 11A-1 and 11A-2 may be formed with any suitable processing. Example processing is described with reference to FIGS. 12-20.

Figure 12:
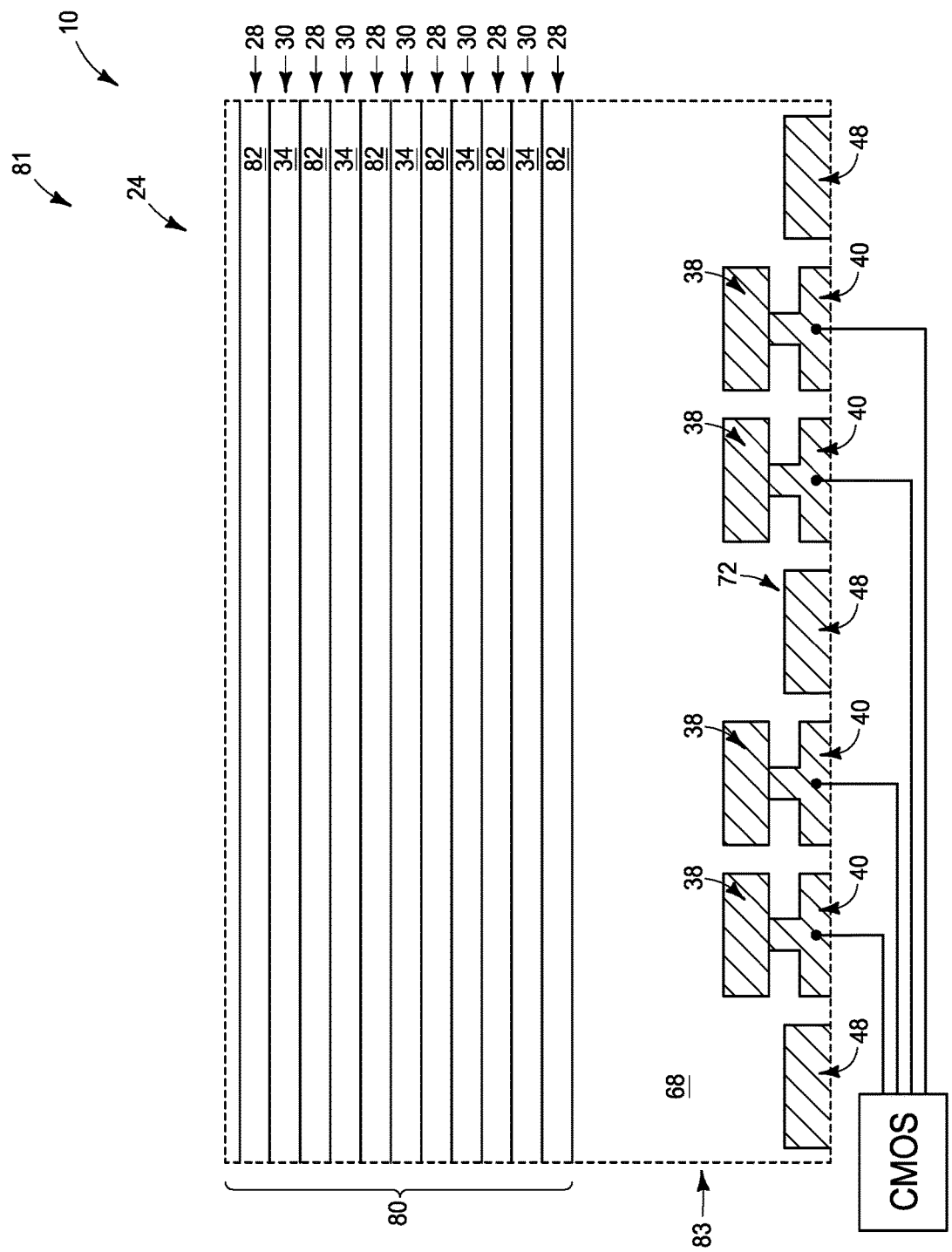
FIGS. 12-12B are diagrammatic cross-sectional side views of regions of an example assembly in accordance with an example process stage of an example embodiment. The view of FIG. 12 is a diagrammatic cross-sectional side view along a cross-section analogous to the cross-section utilized for the view of FIG. 10A. The view of FIG. 12A is a diagrammatic cross-sectional side view along a memory array region. The cross-section of FIG. 12A is analogous to the cross-section utilized for the view of FIG. 6. The view of FIG. 12B is a diagrammatic cross-sectional side view along a staircase region.

Referring to FIG. 12, the assembly 10 is shown at a preliminary process stage during fabrication of the configuration shown in FIG. 10A. The view of FIG. 12 is along the same cross-section as shown in FIG. 10A.

Figure 12A:
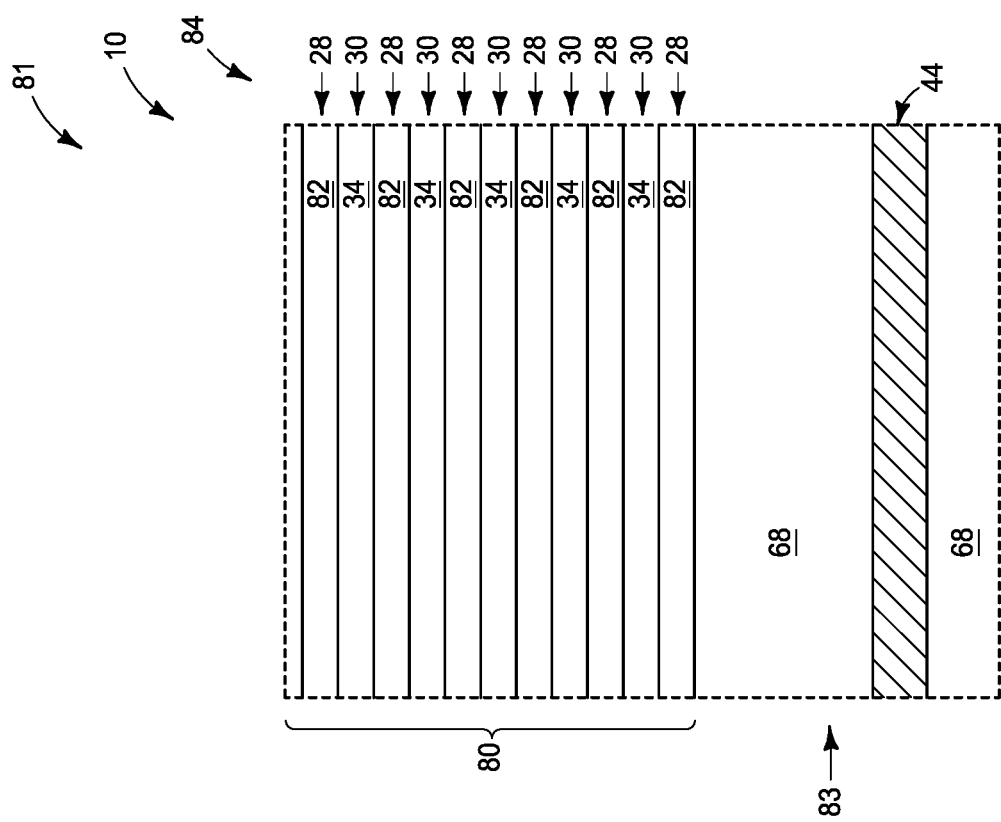
Figure 12B:
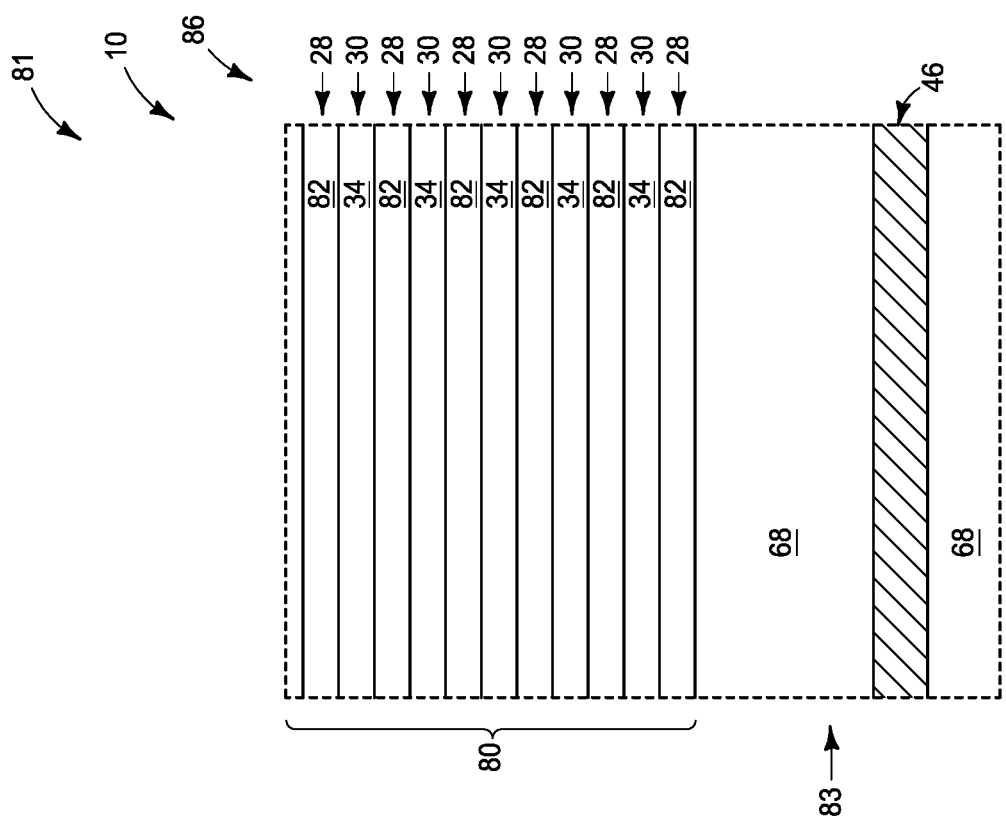

The assembly 10 of FIG. 12 may be considered to be part of a construction 81 which has a memory array region 84 (shown in FIG. 12A) and a staircase region 86 (shown in FIG. 12B). The region of the assembly 10 shown FIG. 12 may be considered to be an intervening region (crest region, interconnect region) 24, with such intervening region being between the staircase region and the memory array region. The construction of FIGS. 12-12B includes a first conductive expanse 44 (a source structure) in the memory array region 84 (FIG. 12A), and a second conductive expanse 46 in the staircase region 86 (FIG. 12B). The first and second conductive expanses 44 and 46 are at a same elevational level as one another, and such elevational level may be referred to as a first elevational level.

The first and second conductive expanses 44 and 46 may comprise conductively-doped semiconductor material over metal silicide; and in some embodiments may comprise conductively-doped silicon over tungsten silicide.

The construction 81 of FIGS. 12-12B includes conductive blocks 38 in the intervening region 24 (FIG. 12A), and such conductive blocks are at the same elevational level as the expanses 44 and 46 (i.e., the first elevational level). The construction comprises a gap between the first and second expanses 44 and 46 in the intervening region (such gap is shown in FIG. 10B as a gap 88). The construction comprises bridging structures (support structures) 48 across the gap, with such bridging structures 48 being shown in FIG. 12. The bridging structures 48 are at a different elevational level than first elevational level of the structures 38, 44 and 46 (i.e., are at a second elevational level which is different than the first elevational level). In the shown embodiment, the second elevational level of the bridging structures 48 is beneath the first elevational level of the structures 38, 44 and 46. Additional structures (e.g., protecting structures 50 of the type shown in FIGS. 10-10C) may be formed within the construction 81 in some embodiments.

The conductive structures 40 may be coupled with logic circuitry (CMOS), analogous to the coupling shown in FIG. 10-10C. Such coupling may be provided at the process stage of FIG. 12-12B (as shown) or at any other suitable process stage.

An insulating material 68 is around the structures 38, 40, 44, 46 and 48. The insulating material may comprise silicon dioxide and/or any other suitable composition(s). The structures 38, 40, 44, 46 and 48 of FIGS. 12-12B may be formed with any suitable processing. For instance, one or more metals (e.g. tungsten) may be deposited and patterned utilizing one or more of damascene processing, lithographic mask patterning, etc.

A stack 80 of alternating first and second levels 28 and 30 is formed over a region 83 (structure, architecture, construction) comprising the features 38, 40, 44, 46 and 48. The first levels 28 comprise sacrificial material 82, and the second levels 30 comprise the insulative material 34. The sacrificial material 82 may comprise any suitable composition(s); and in some embodiments may comprise, consist essentially of, or consist of silicon nitride.

The views of FIGS. 12, 12A and 12B show fragments of the various regions 24, 84 and 86, but do not show the same size fragments as one another. Specifically, the fragment of FIG. 12 is larger than the fragments of FIGS. 12A and 12B. Such simplifies the drawings while still illustrating pertinent details.

Figure 13:
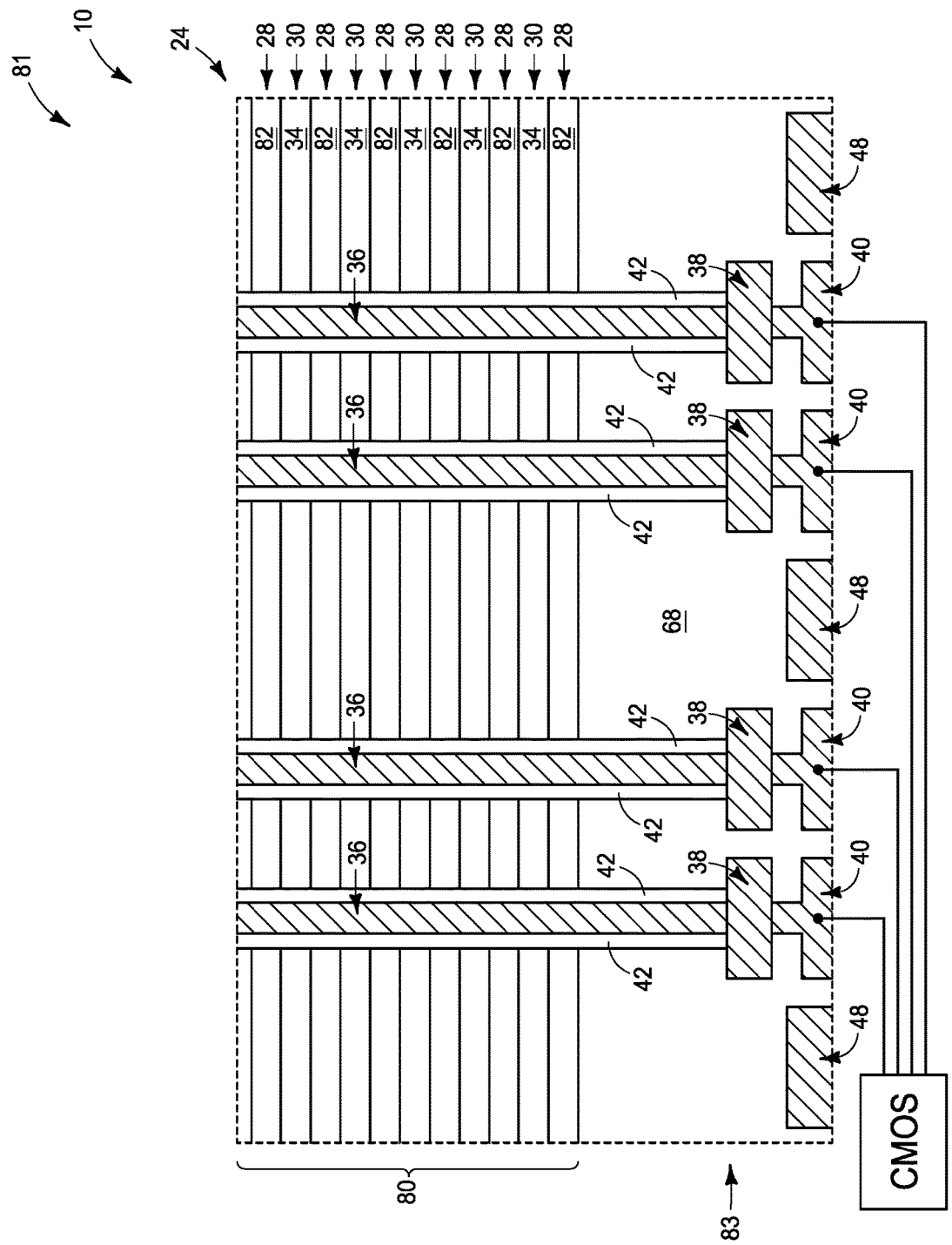
FIGS. 13-13B are diagrammatic cross-sectional side views of regions of the example assembly of FIGS. 12-12B at a process stage subsequent to that of FIGS. 12-12B in accordance with an example embodiment.
Figure 13A:
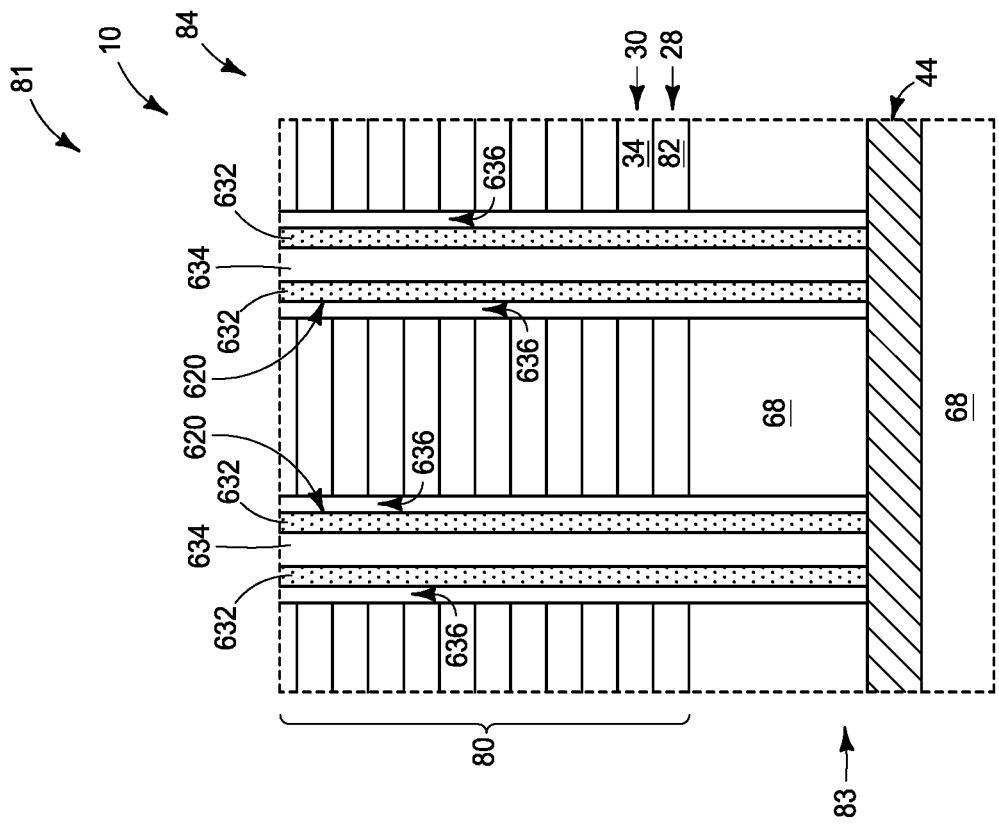
Figure 13B:
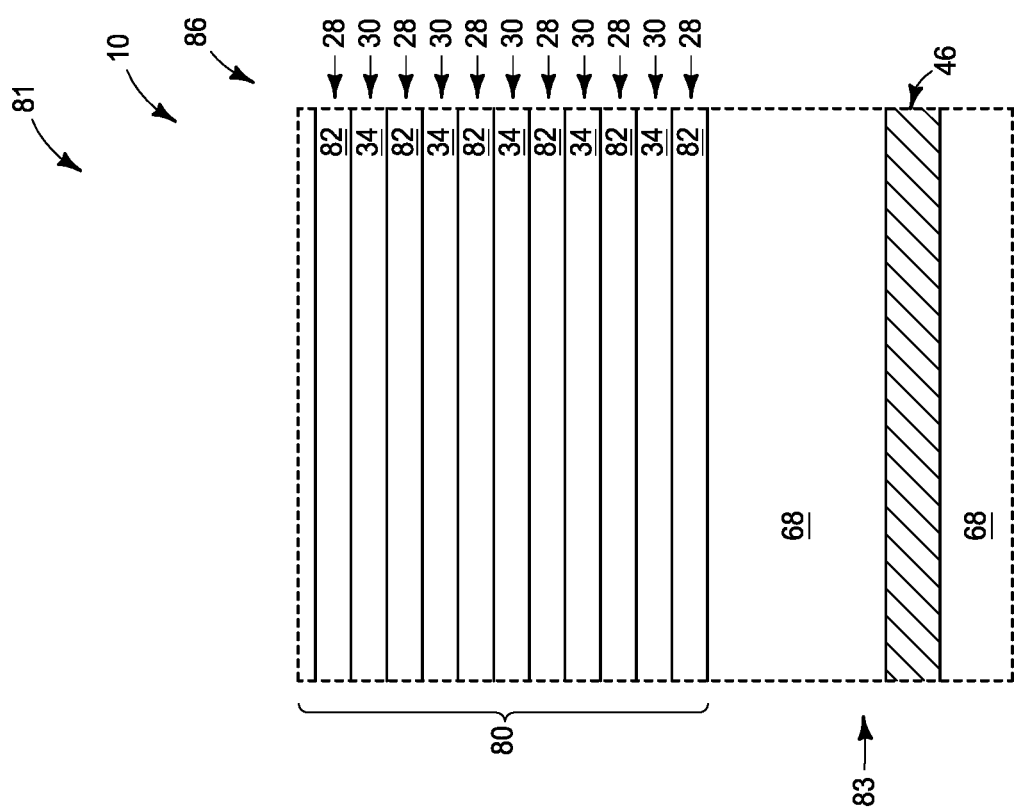

Referring to FIG. 13-13B, the conductive interconnects 36 are formed within the crest region 24 (FIG. 13), and the insulative material 42 is formed adjacent such conductive interconnects. Also, channel material pillars 620 are formed within the memory array region 84 (FIG. 13A). In some embodiments, openings may be formed through the stack 80 and into the construction 81, and then appropriate materials may be formed within such openings to form the channel material pillars within the memory array region 84 of FIG. 13A and the interconnects 36 within the crest region 24 of FIG. 13. The channel material 632 of the channel material pillars 620 is electrically coupled with the source structure 44 (i.e., the conductive expanse 44), and in the shown embodiment directly contacts conductive material of the source structure 44.

Figure 14:
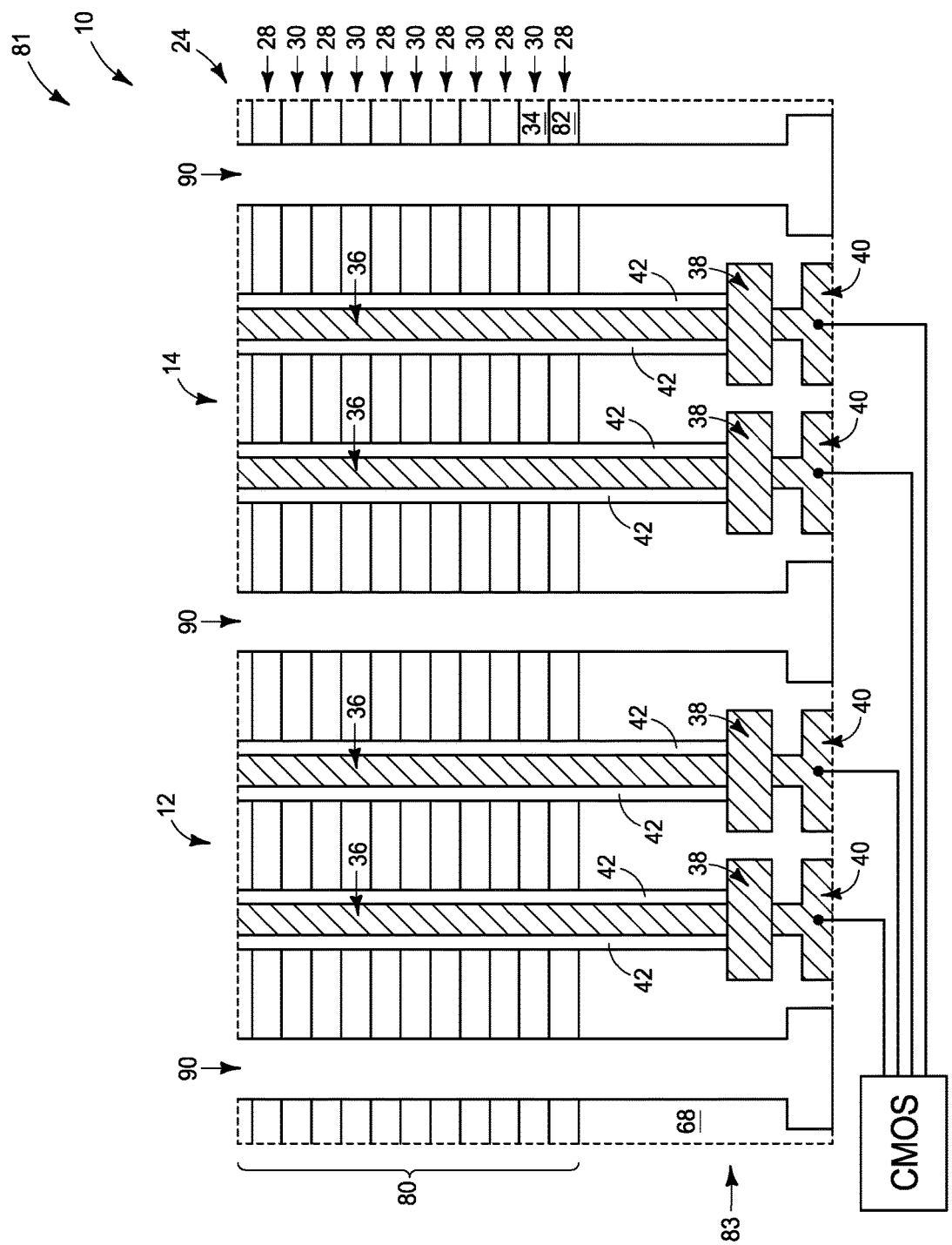
FIGS. 14-14B are diagrammatic cross-sectional side views of regions of the example assembly of FIGS. 12-12B at a process stage subsequent to that of FIGS. 13-13B in accordance with an example embodiment.
Figure 14A:
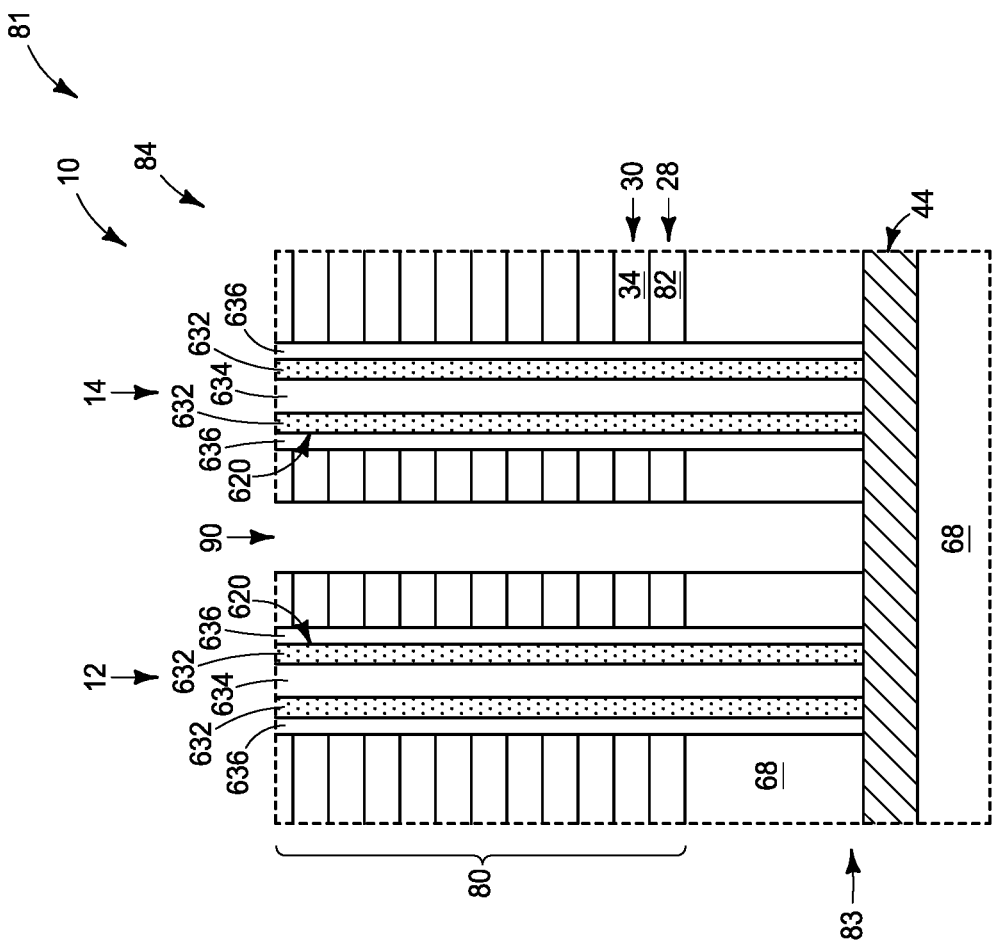
Figure 14B:
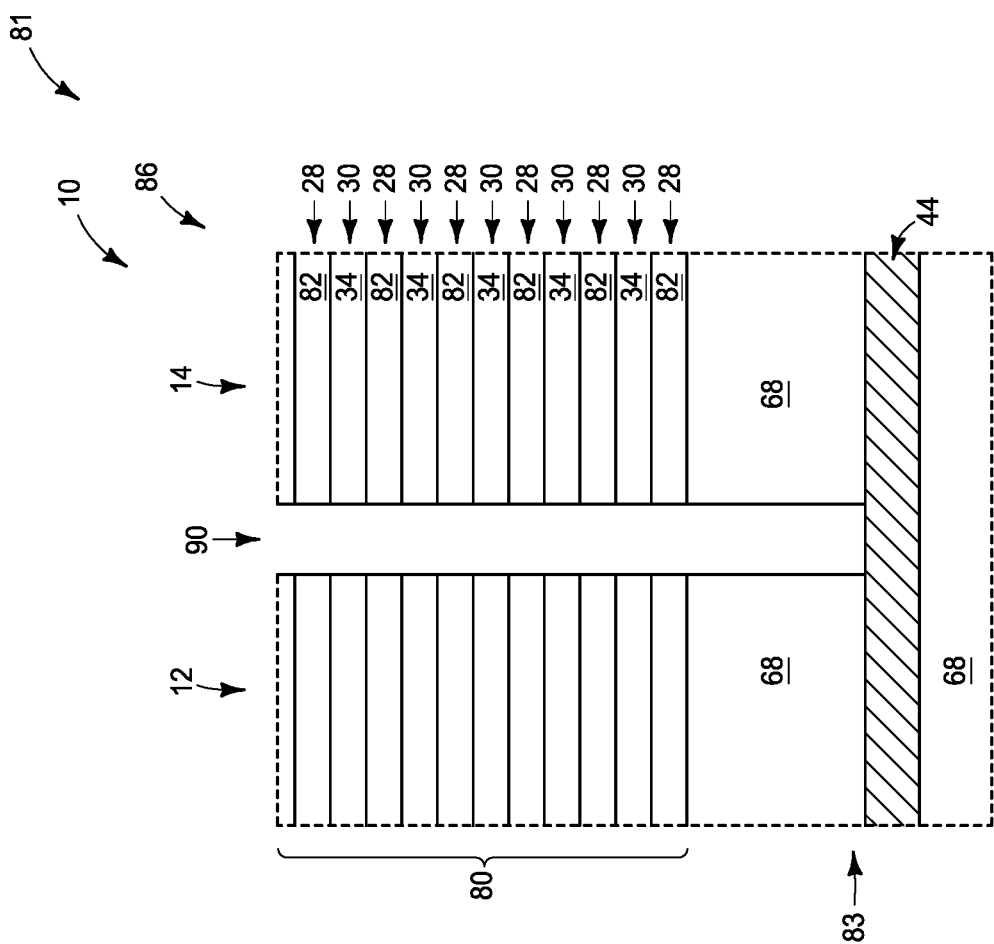

Referring to FIGS. 14-14B, slits 90 are formed to extend through the stack 80. Each of the slits has a first portion within the memory array region 84 (FIG. 14A), a second portion within the crest region 24 (FIG. 14) and a third portion within the staircase region 86. The slits may separate memory blocks (memory block regions) from one another. In the shown embodiment one of the slits 90 is shown to separate a first memory block (memory block region) 12 from a second memory block (memory block region) 14.

The slits 90 may stop at upper surfaces of the structures 48 to ultimately form a configuration analogous to that of FIG. 10A. However, in the illustrated embodiment of FIG. 14 the slits 90 penetrate through the material 48 (FIG. 13) to form a configuration analogous to that of FIGS. 10A-1 and 10A-2. Although the entirety of the material of the structures 48 is eliminated during formation of the slits 90, in other embodiments some of the material of the structures 48 may remain. The amount of material of the structures 48 remaining after the formation of the slits 90 may be tailored by modifying the composition of the material of the structures 48 and/or the etching conditions utilized to form the slits 90.

One problem that may occur during conventional processes of forming slits analogous to the slits 90 is that regions of the slits may penetrate into the source structure (i.e., the source structure 640 of FIGS. 9-9C). If the source structure comprises conductively-doped silicon over titanium silicide, galvanic corrosion may problematically remove substantial portions of the conductively-doped silicon from regions outward of the slit. The embodiments described herein may alleviate such problematic galvanic corrosion, at least relative to portions of the slits 90 formed over the structures 48.

Figure 15:
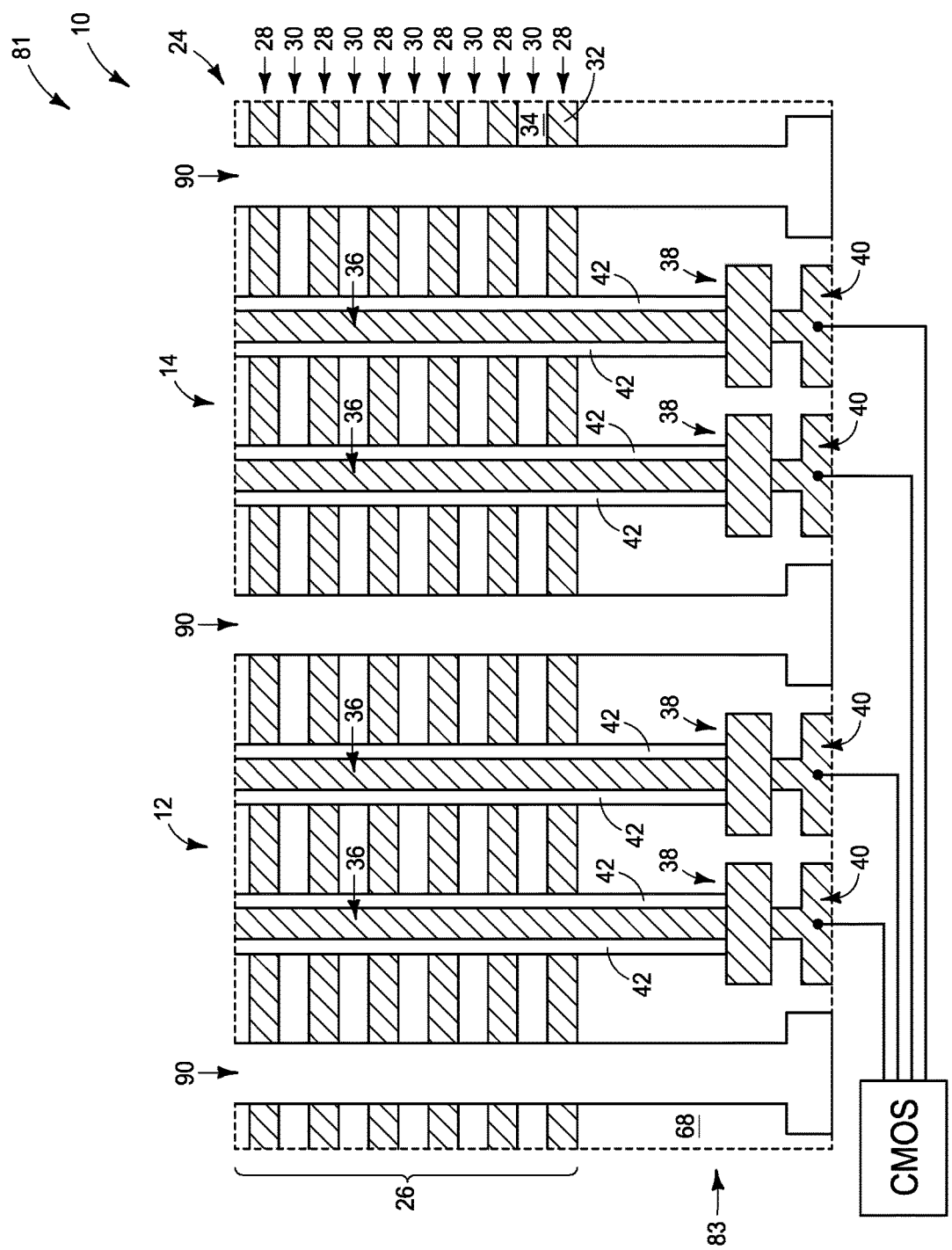
FIGS. 15-15B are diagrammatic cross-sectional side views of regions of the example assembly of FIGS. 12-12B at a process stage subsequent to that of FIGS. 14-14B in accordance with an example embodiment.
Figure 15A:
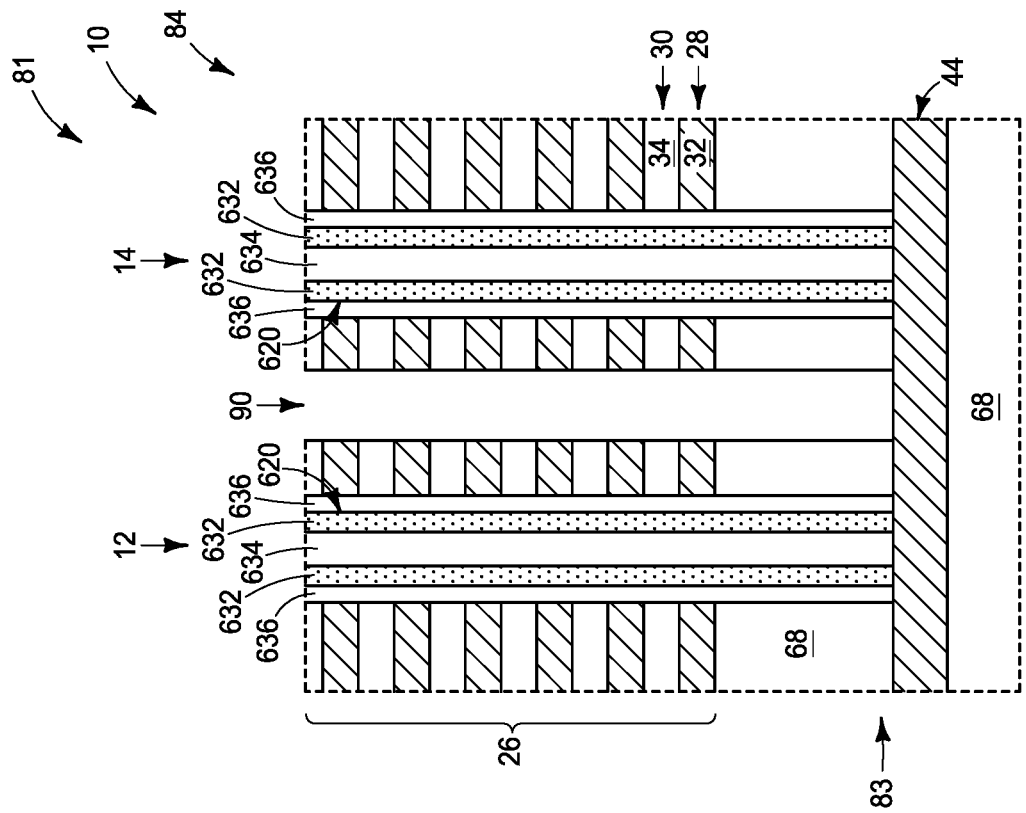
Figure 15B:
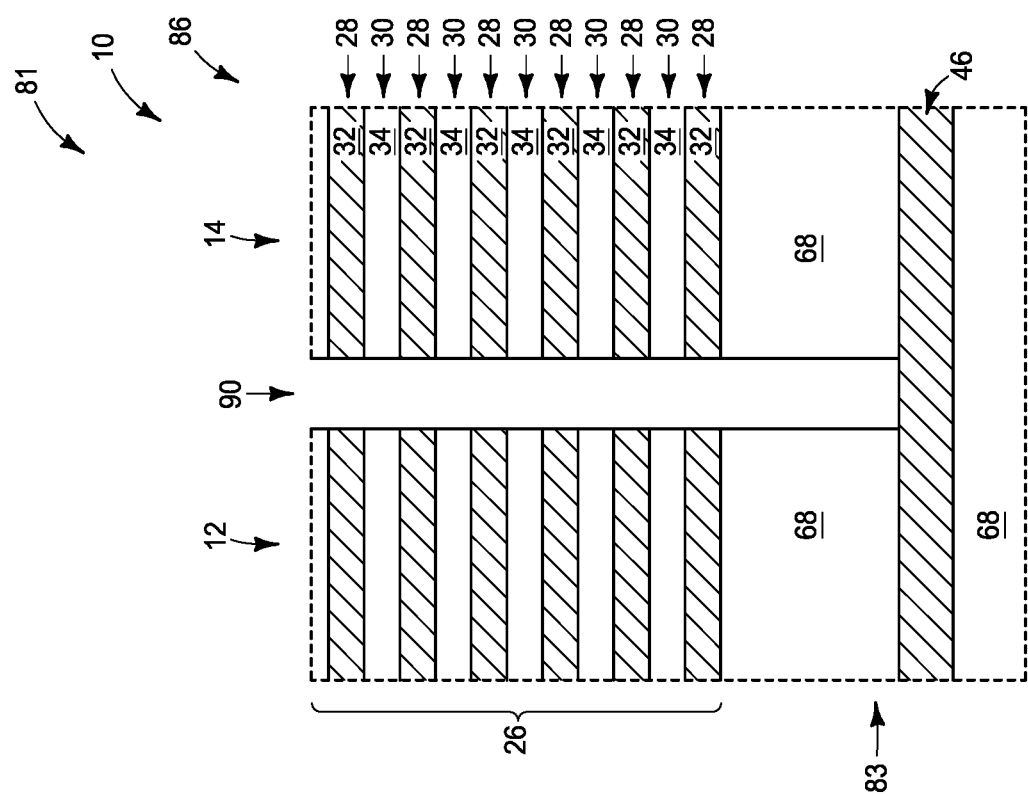

Referring to FIGS. 15-15B, the sacrificial material 82 (FIGS. 14-14B) is removed and replaced with the conductive material 32. Accordingly, the stack 80 of FIGS. 14-14B is converted to the stack 26 comprising alternating conductive and insulative levels 28 and 30. The sacrificial material 82 may be removed with any suitable processing. For instance, etchant (e.g., hot phosphoric acid) may be flowed into the slits 90 to remove the sacrificial material in embodiments in which the sacrificial material comprises silicon nitride.

Figure 16:
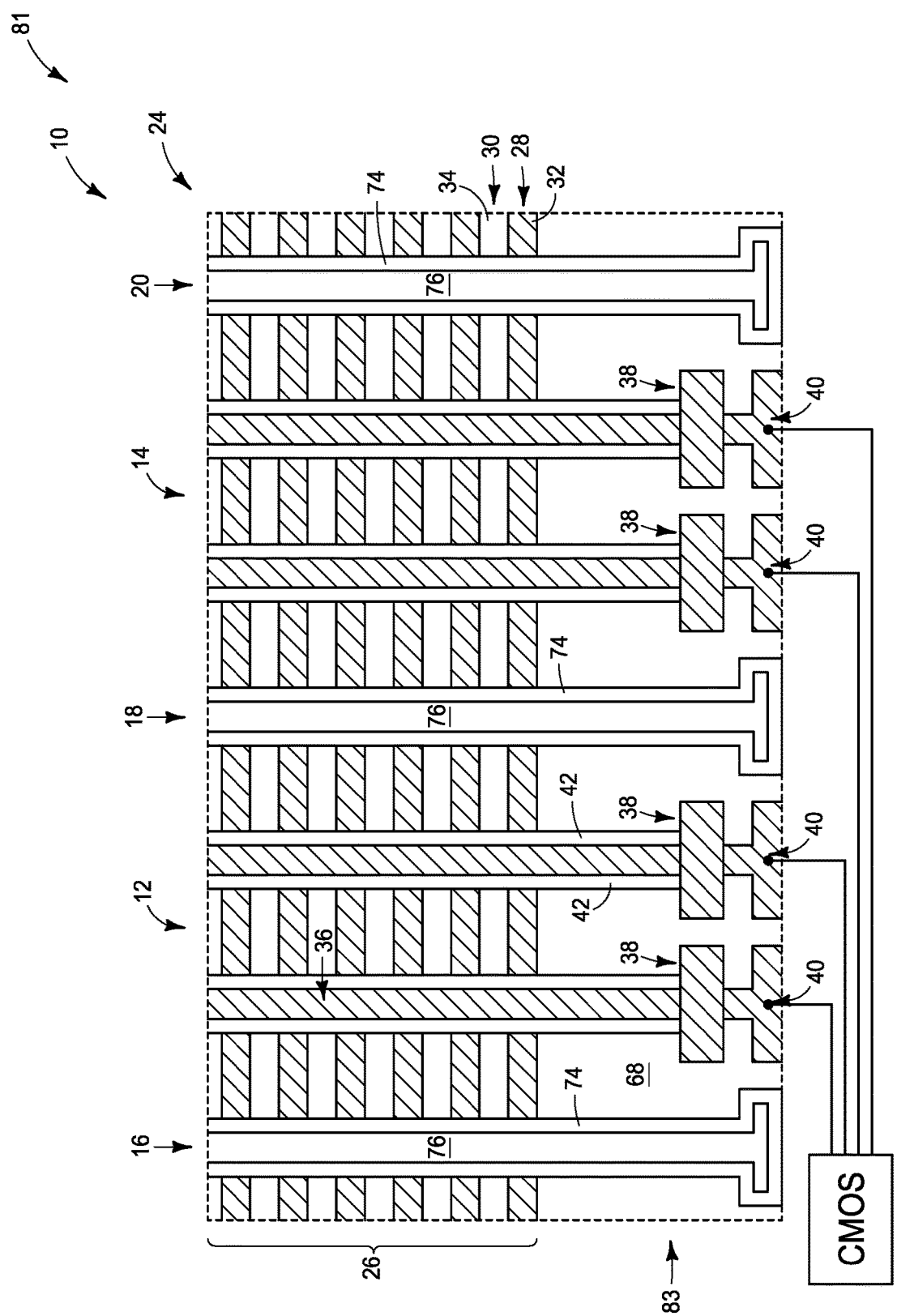
FIGS. 16-16B are diagrammatic cross-sectional side views of regions of the example assembly of FIGS. 12-12B at a process stage subsequent to that of FIGS. 15-15B in accordance with an example embodiment.
Figure 16A:
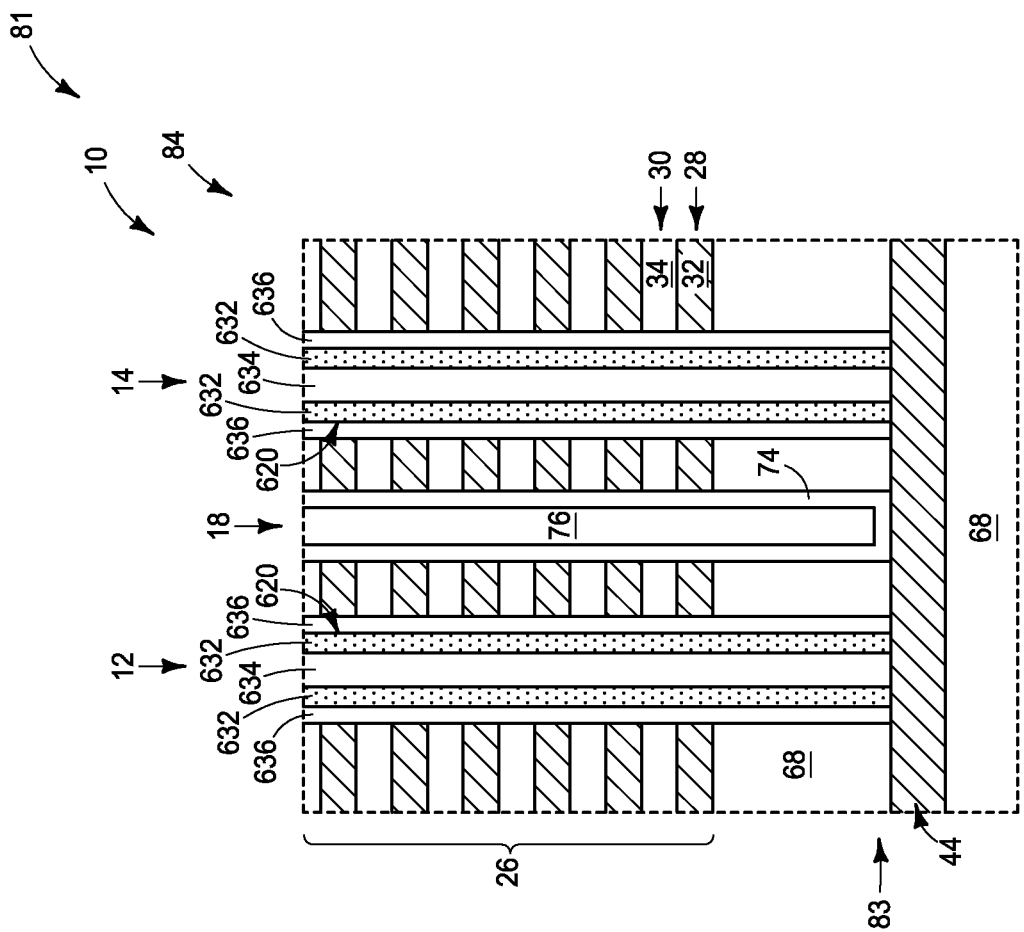
Figure 16B:
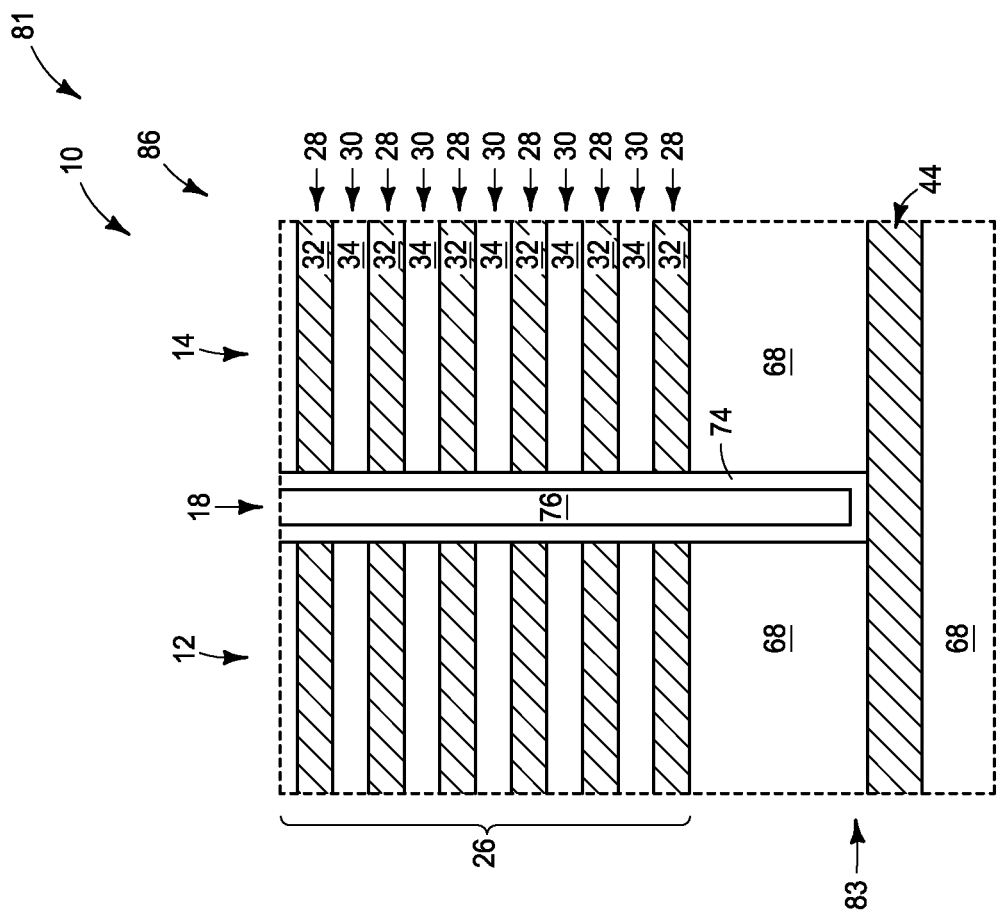

Referring to FIGS. 16-16B, the materials 74 and 76 are formed within the slits 90 (FIGS. 15-15B) to thereby form the panels 16, 18 and 20. Although two materials are shown being formed within the slits, in other embodiments there may be only a single material formed within the slits (e.g., the material 22 of FIGS. 10-10C) or there may be more than two materials formed within the slits.

Figure 8:
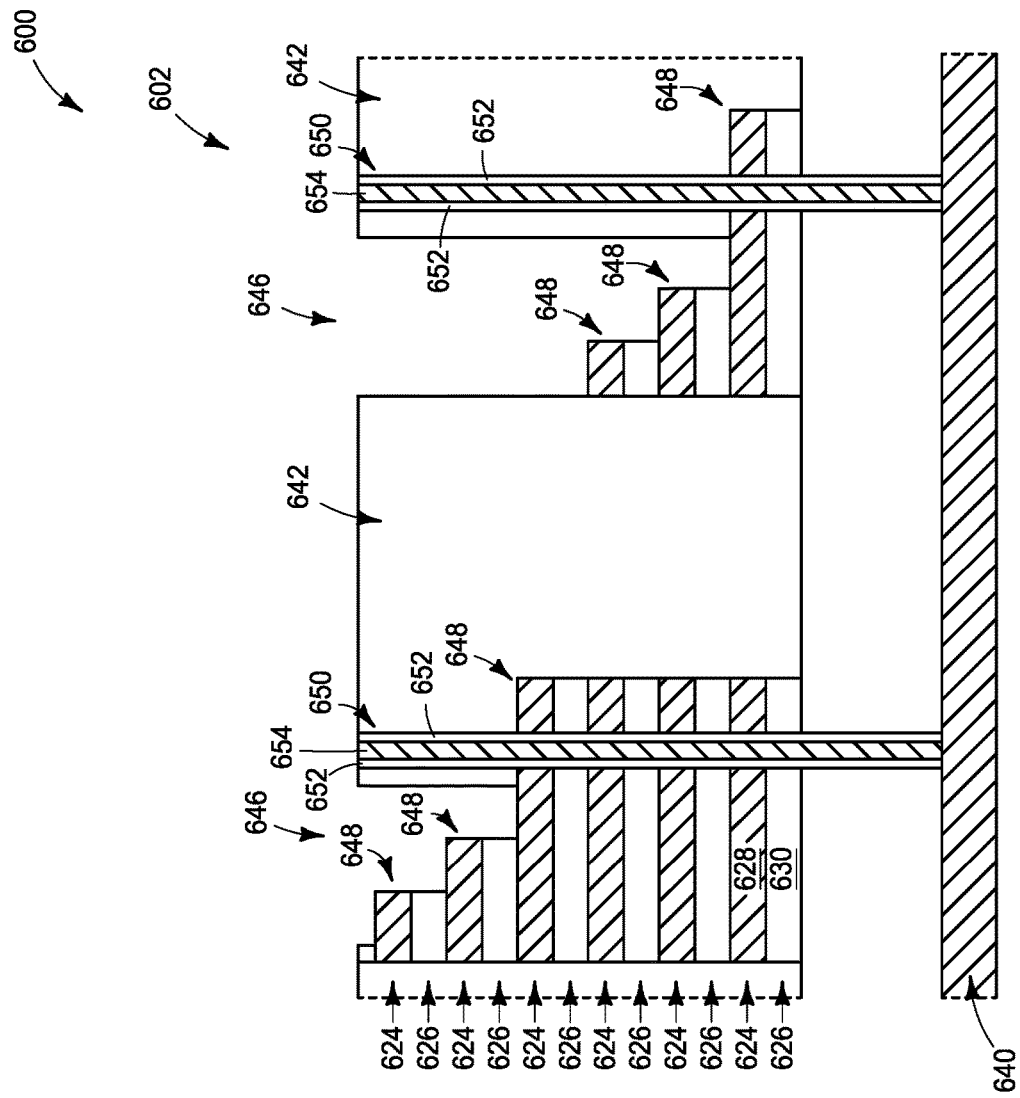
FIG. 8 is a diagrammatic cross-sectional side view along a line 8-8 of the prior art integrated assembly of FIG. 7.

The staircase region 86 of FIG. 16B may comprise stepped interconnect regions analogous to the regions 648 of FIG. 8. The stepped interconnect regions are not shown in FIG. 16B to keep the focus on the formation of the panel 18 rather than on formation of the stepped interconnect regions. It is to be understood, however, that the stepped interconnect regions may be formed with any suitable processing at any suitable process stage.

Processing similar the described above with reference to FIGS. 12-16 may be utilized to form the configuration of FIGS. 11-11C in which the support structures 48 are at an elevational level above the level of the conductive expanses 44 and 46. Example processing is described with reference to FIGS. 17-20. FIGS. 17-20 only show cross-sections along the intervening region (crest region) 24, as the processing along the memory array region and staircase region may be identical to that described above with reference to FIGS. 12-16.

Figure 17:
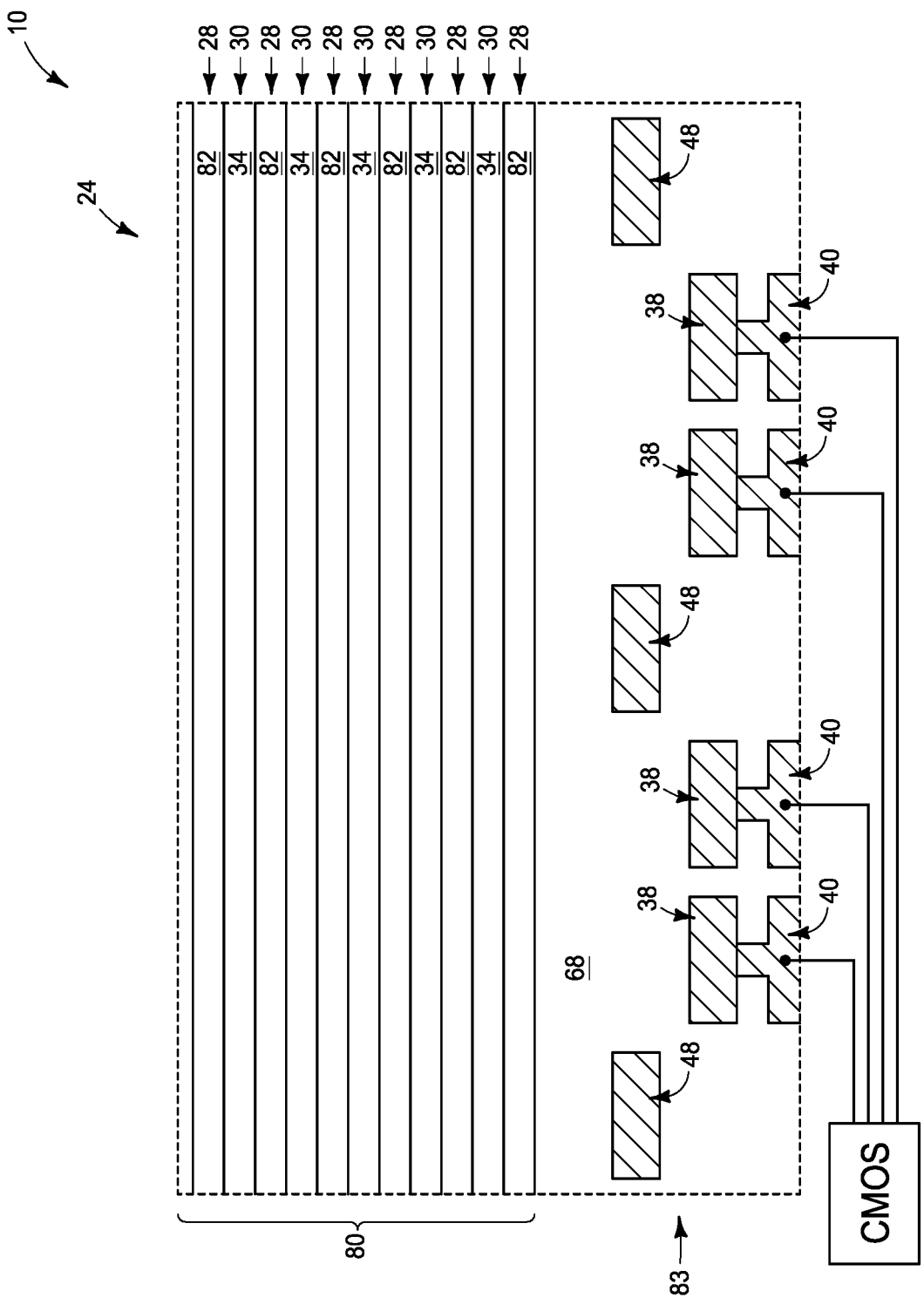
FIGS. 17-20 are diagrammatic cross-sectional side views of regions of an example assembly at example sequential process stages of an example embodiment. The views of FIGS. 17-20 are along a cross-section analogous to the cross-section utilized for the view of FIG. 11A.

Referring to FIG. 17, the assembly 10 is shown at a process stage in which the construction 83 is formed to have the support structures 48 at an elevational level above the contacts 38. The cross-section of FIG. 17 shows a crest region 24. Such crest region may be analogous to that described above with reference to FIG. 11A, but is shown at a preliminary process stage utilized in the fabrication of the configuration of FIG. 11A. The conductive structures 48 may be considered to be at a second elevational level which is above a first elevational level of the contacts 38 and of the expanses 44 and 46 (shown in FIG. 11B).

The stack 80 of alternating levels 28 and 30 is formed over the construction 83. The levels 28 comprise the sacrificial material 82.

Figure 18:
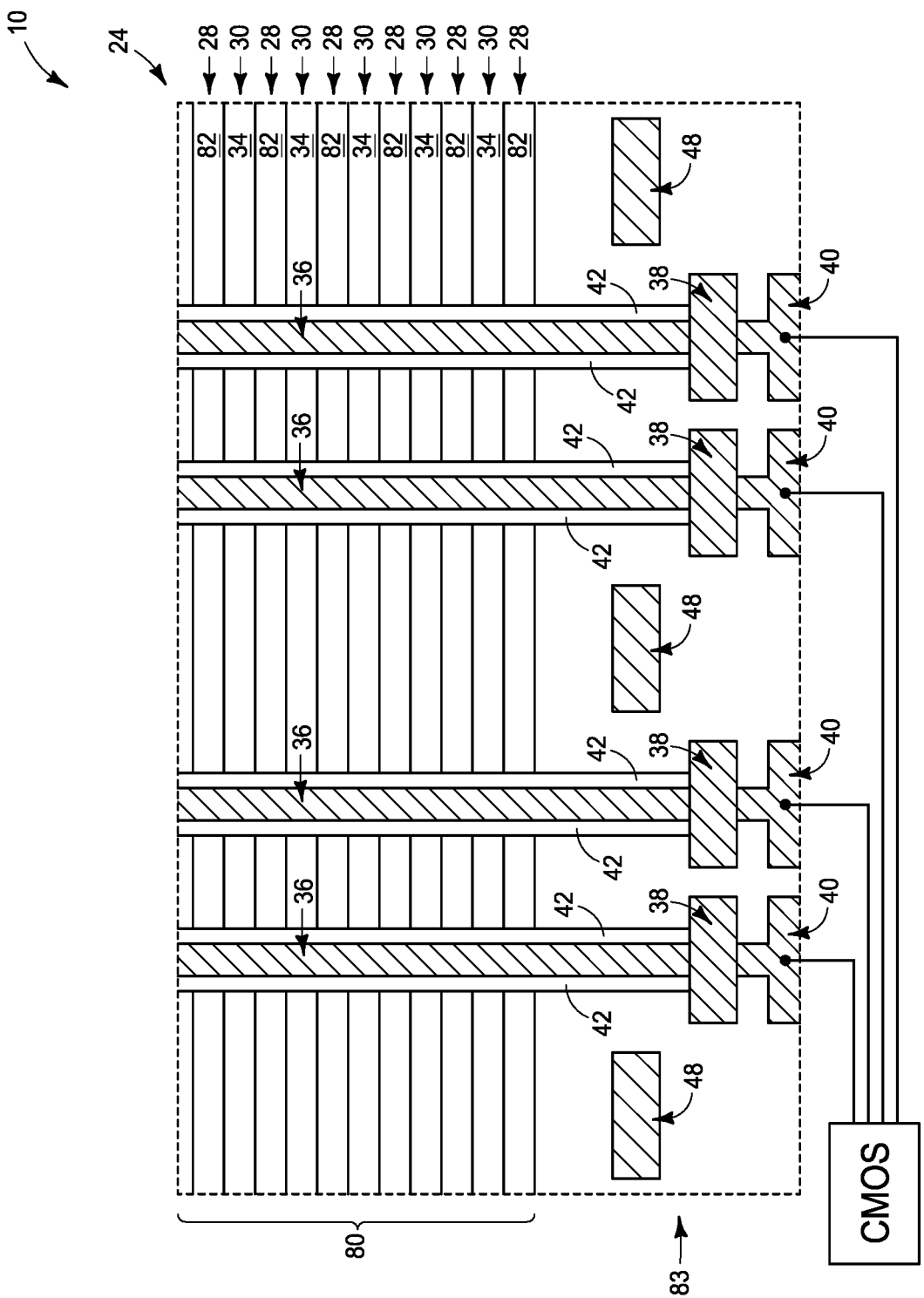

Referring to FIG. 18, the conductive interconnects 36 are formed with processing analogous that described above with reference to FIG. 13.

Figure 19:
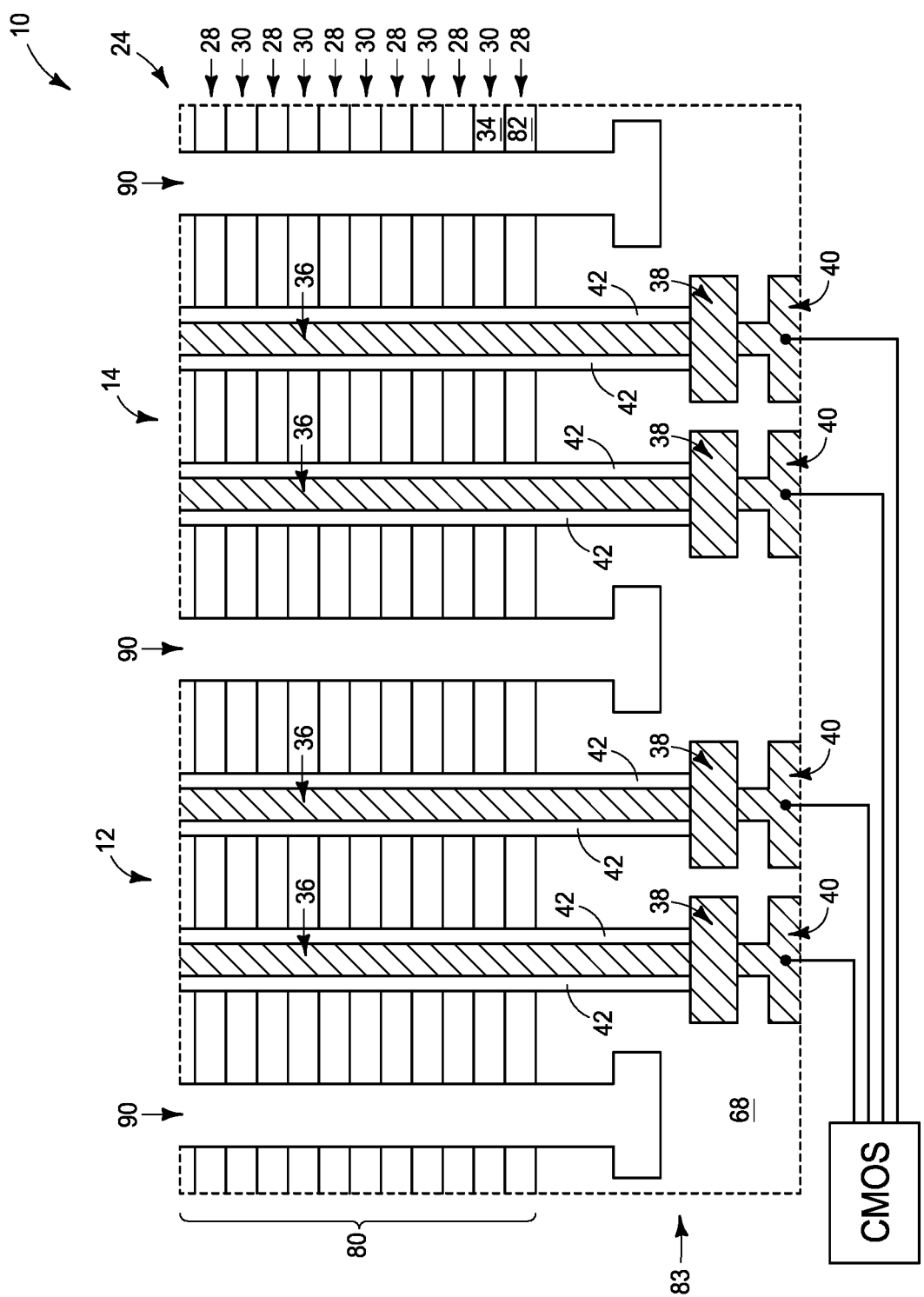

Referring to FIG. 19, the slits 90 are formed with processing analogous to that described above with reference to FIG. 14. The shown embodiment, the slits 90 extend through the conductive structures 48. In other embodiments, at least some regions of the conductive structures 48 may remain after formation of the slits 90.

Figure 20:
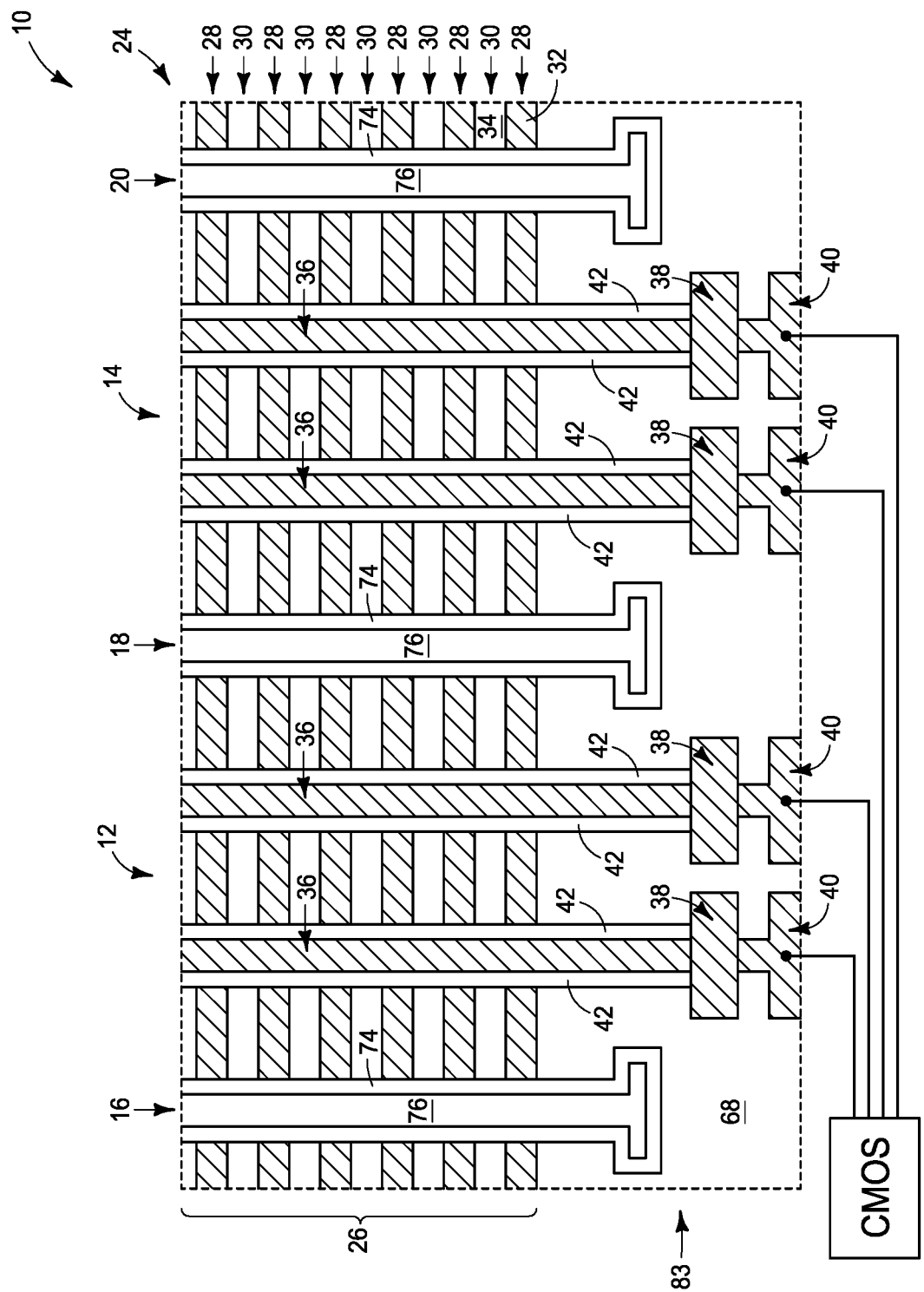

Referring to FIG. 20, the sacrificial material 82 (FIG. 19) is removed and replaced with conductive material 32 utilizing processing analogous to that described above with reference to FIG. 15, and subsequently the materials 74 and 76 are deposited within the slits 90 (FIG. 19) to form the panels 16, 18 and 20. The assembly 10 of FIG. 20 is identical to that of FIG. 11A-2. Other suitable processing may be utilized to form the assemblies of FIGS. 11A and 11A-1.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a memory array region which includes channel material pillars extending through a stack of alternating conductive levels and insulative levels. A second region is adjacent the memory array region. A conductive expanse is within the memory array region and is electrically coupled with the channel material of the channel material pillars. A panel extends across the memory array region and the second region. The panel separates one memory block region from another. The panel has a first portion supported by a region of the conductive expanse and has a second portion adjacent the first portion. The panel has a bottom surface. A first region of the bottom surface is adjacent an upper surface of the conductive expanse. A second region of the bottom surface is within the second portion and is elevationally offset relative to the first region of the bottom surface.

Some embodiments include an integrated assembly having a memory array region which includes channel material pillars extending through a stack of alternating conductive levels and insulative levels. A staircase region is offset from the memory array region and comprises regions of the conductive levels. An interconnect region is between the memory array region and the staircase region. A first conductive expanse is within the memory array region and is electrically coupled with the channel material of the channel material pillars. A second conductive expanse is within the staircase region and is at a same elevational level as the first conductive expanse. A panel extends across the memory array region, the interconnect region and the staircase region. The panel separates one memory block region from another. The panel has a first portion supported by a region of the first conductive expanse, a third portion supported by a region of the second conductive expanse, and a second portion between the first and third portions. The second portion has a bottom surface which is elevationally offset relative to bottom surfaces of the first and third portions.

Some embodiments include a method of forming an integrated assembly. A construction is formed to have a memory array region, a staircase region, and an intervening region between the staircase region and the memory array region. The construction comprises a first conductive expanse in the memory array region and a second conductive expanse in the staircase region. The first and second conductive expanses are at a first elevational level. The construction comprises conductive blocks in the intervening region. The conductive blocks are at the first elevational level. The construction comprises a gap between the first and second expanses in the intervening region, and comprises a bridging structure extending across said gap. The bridging structure is at a second elevational level which is different from the first elevational level. A stack of alternating first and second levels is formed over the construction. The first levels comprise sacrificial material and the second levels comprise insulative material. Channel material pillars are formed to extend through the stack in the memory array region. The channel material of the channel material pillars is electrically coupled with the first conductive expanse. A slit is formed to extend through the stack. The slit has a first portion along the first conductive expanse of the memory array region, has a second portion along the bridging structure of the intervening region, and has a third portion along the second expanse of the staircase region. The slit spaces a first memory block region from a second memory block region. The sacrificial material is removed and replaced with conductive material. One or more materials are formed within the slit.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
a memory array region which includes channel material pillars extending through a stack of alternating conductive levels and insulative levels;
a second region adjacent the memory array region;
a conductive expanse within the memory array region and electrically coupled with the channel material of the channel material pillars;
a panel extending across the memory array region and the second region; the panel separating one memory block region from another; the panel having a first portion supported by a region of the conductive expanse and having a second portion adjacent the first portion;
the panel having a bottom surface;
a first region of the bottom surface being adjacent an upper surface of the conductive expanse; and
a second region of the bottom surface being within the second portion and being elevationally offset relative to the first region of the bottom surface.

2. The integrated assembly of claim 1 wherein the second region of the bottom surface is above the first region of the bottom surface.

3. The integrated assembly of claim 1 wherein the second region of the bottom surface is below the first region of the bottom surface.

4. The integrated assembly of claim 1 wherein the second region of the bottom surface is directly against a support structure within the second region.

5. The integrated assembly of claim 4 wherein the support structure is below the conductive expanse.

6. The integrated assembly of claim 4 wherein the support structure is above the conductive expanse.

7. The integrated assembly of claim 4 wherein the panel comprises silicon dioxide; and wherein the silicon dioxide directly contacts the upper surface of the conductive expanse and directly contacts the upper surface of the support structure.

8. The integrated assembly of claim 7 wherein the conductive expanse comprises conductively-doped semiconductor material over metal silicide.

9. The integrated assembly of claim 7 wherein the conductive expanse comprises conductively-doped silicon over WSi, where a chemical formula indicates primary constituents rather than a specific stoichiometry.

10. The integrated assembly of claim 7 wherein the support structure comprises a different composition than the conductive expanse.

11. The integrated assembly of claim 7 wherein the support structure comprises one or more metals.

12. The integrated assembly of claim 7 wherein the support structure consists of one or more metals.

13. The integrated assembly of claim 7 wherein the support structure consists of tungsten.

14. The integrated assembly of claim 1 wherein conductive blocks are within the second region at a same elevational level as the conductive expanse; wherein the conductive blocks are coupled with logic circuitry; wherein conductive interconnects extend upwardly from the conductive blocks; and wherein the conductive interconnects couple circuitry of the memory array with the logic circuitry.

15. The integrated assembly of claim 14 wherein the circuitry of the memory array comprises drain-side select gate (SGD) devices.

16. An integrated assembly, comprising:
- a memory array region which includes channel material pillars extending through a stack of alternating conductive levels and insulative levels;
- a staircase region offset from the memory array region and comprising regions of the conductive levels;
- an interconnect region between the memory array region and the staircase region;
- a first conductive expanse within the memory array region and electrically coupled with the channel material of the channel material pillars;
- a second conductive expanse within the staircase region at a same elevational level as the first conductive expanse; and
- a panel extending across the memory array region, the interconnect region and the staircase region; the panel separating one memory block region from another; the panel having a first portion supported by a region of the first conductive expanse, a third portion supported by a region of the second conductive expanse, and a second portion between the first and third portions; the second portion having a bottom surface which is elevationally offset relative to bottom surfaces of the first and third portions.

17. The integrated assembly of claim 16 wherein the bottom surface of the second portion is above the bottom surfaces of the first and third portions.

18. The integrated assembly of claim 16 wherein the bottom surface of the second portion is below the bottom surfaces of the first and third portions.

19. The integrated assembly of claim 16 comprising a support structure extending from the first conductive expanse to the second conductive expanse; the support structure being elevationally offset relative to the first and second conductive expanses; and wherein the second portion of the panel is supported by the support structure.

20. The integrated assembly of claim 19 wherein the support structure is below the first and second conductive expanses.

21. The integrated assembly of claim 20 further comprising:
- a first protecting structure directly above an edge of the first conductive expanse;
- a second protecting structure directly above an edge of the second conductive expanse; and
- fourth and fifth portions of the panel over the first and second protecting structures, respectively; the fourth and fifth portions having bottom surfaces above the bottom surfaces of the first and third portions of the panel.

22. The integrated assembly of claim 20 wherein the support structure, the first protecting structure and the second protecting structure are all a same composition as one another.

23. The integrated assembly of claim 22 wherein the support structure, the first protecting structure and the second protecting structure comprise one or more metals.

24. The integrated assembly of claim 22 wherein the support structure, the first protecting structure and the second protecting structure consist essentially of tungsten.

25. The integrated assembly of claim 19 wherein the support structure is above the first and second conductive expanses.

26. The integrated assembly of claim 16 wherein the second conductive expanse is electrically floating.

27. The integrated assembly of claim 16 wherein the second conductive expanse is coupled with a reference voltage source.

28. A method of forming an integrated assembly, comprising:
- forming a construction having a memory array region, a staircase region, and an intervening region between the staircase region and the memory array region; the construction comprising a first conductive expanse in the memory array region and a second conductive expanse in the staircase region; the first and second conductive expanses being at a first elevational level; the construction comprising conductive blocks in the intervening region, the conductive blocks being at the first elevational level; the construction comprising a gap between the first and second expanses in the intervening region, and comprising a bridging structure extending across said gap; the bridging structure being at a second elevational level which is different from the first elevational level;
- forming a stack of alternating first and second levels over the construction; the first levels comprising sacrificial material and the second levels comprising insulative material;
- forming channel material pillars to extend through the stack in the memory array region; the channel material of the channel material pillars being electrically coupled with the first conductive expanse;
- forming a slit to extend through the stack; the slit having a first portion along the first conductive expanse of the memory array region, having a second portion along the bridging structure of the intervening region, and having a third portion along the second expanse of the staircase region; the slit spacing a first memory block region from a second memory block region;
- removing the sacrificial material and replacing it with conductive material; and
- forming one or more materials within the slit.

29. The method of claim 28 wherein the second elevational level is above the first elevational level.

30. The method of claim 28 wherein the second elevational level is below the first elevational level.

31. The method of claim 30 further comprising:
- forming a first protecting structure within the construction and directly above an edge of the first conductive expanse, with said edge of the first conductive expanse being over the bridging structure;
- forming a second protecting structure within the construction and directly above an edge of the second conductive expanse, with said edge of the second conductive expanse being over the bridging structure; and
- forming the slit to have fourth and fifth portions along the first and second protecting structures, respectively.

32. The method of claim 28 wherein the said one or more materials include silicon dioxide.

33. The method of claim 28 wherein the said one or more materials include silicon dioxide and silicon.

34. The method of claim 28 wherein the first conductive expanse, second conductive expanse and conductive blocks comprise conductively-doped silicon over tungsten silicide.

35. The method of claim 28 wherein the bridging structure comprises metal.

36. The method of claim 28 wherein the bridging structure comprises tungsten.

37. The method of claim 28 further comprising extending the slit through the bridging structure prior to forming said one or more materials within the slit.

\* \* \* \* \*